United States Patent
Lee et al.

(10) Patent No.: US 8,559,232 B2
(45) Date of Patent: Oct. 15, 2013

(54) DRAM-LIKE NVM MEMORY ARRAY AND SENSE AMPLIFIER DESIGN FOR HIGH TEMPERATURE AND HIGH ENDURANCE OPERATION

(75) Inventors: Peter Wung Lee, Saratoga, CA (US); Fu-Chang Hsu, San Jose, CA (US)

(73) Assignee: APlus Flash Technology, Inc., San Jose, CA (US)

( * ) Notice: Subject to any disclaimer, the term of this patent is extended or adjusted under 35 U.S.C. 154(b) by 300 days.

(21) Appl. No.: 13/094,836

(22) Filed: Apr. 27, 2011

(65) Prior Publication Data

US 2011/0267883 A1    Nov. 3, 2011

Related U.S. Application Data

(60) Provisional application No. 61/343,806, filed on May 3, 2010.

(51) Int. Cl.
*G11C 11/34* (2006.01)

(52) U.S. Cl.
USPC ..................................... 365/185.25; 365/222

(58) Field of Classification Search
USPC ............................................ 365/185.25, 222
See application file for complete search history.

(56) References Cited

U.S. PATENT DOCUMENTS 6,381,670 B1 *   4/2002   Lee et al. ...................... 711/103

* cited by examiner

*Primary Examiner* — Jason Lappas

(57) ABSTRACT

A DRAM-like non-volatile memory array includes a cell array of non-volatile cell units with a DRAM-like cross-coupled latch-type sense amplifier. Each non-volatile cell unit has two non-volatile cell devices with respective bit lines and source lines running in parallel and laid out perpendicular to the word line associated with the non-volatile cell unit. The two non-volatile cell devices are programmed with erased and programmed threshold voltages as a pair for storing a single bit of binary data. The two bit lines of each non-volatile cell unit are coupled through a Y-decoder and a latch device to the two respective inputs of the latch-type sense amplifier which provides a large sensing margin for the cell array to operate properly even with a narrowed threshold voltage gap. Each non-volatile cell device may be a 2T FLOTOX-based EEPROM cell, a 2T flash cell, 1 1T flash cell or a 1.5T split-gate flash cell.

43 Claims, 15 Drawing Sheets

|  | Erase State | Program State |
|---|---|---|
| CELL 12 | Vt1 | Vt0 |
| Logic State | 1 | 0 |

FIG. 4

|  | Unused State 1 | Erase State | Program State | Unused State 0 |
|---|---|---|---|---|
| CELL 104_a | Vt1 | Vt1 | Vt0 | Vt0 |
| CELL 104_b | Vt1 | Vt0 | Vt1 | Vt0 |
| Logic State | NA | 1 | 0 | NA |

FIG. 5

Conventional High Voltage BL Latch for Write Operation (One Byte Set)

High Voltage BL Latch for Write Operation (One Byte Set)

Page Write Operation

DRAM-LIKE NVM MEMORY ARRAY AND SENSE AMPLIFIER DESIGN FOR HIGH TEMPERATURE AND HIGH ENDURANCE OPERATION

CROSS-REFERENCE TO RELATED APPLICATIONS

This application claims priority under 35 U.S.C. §119 to U.S. Provisional Patent Application Ser. No. 61/343,806, filed on May 3, 2010, assigned to the same assignee as the present invention, and incorporated herein by reference in its entirety.

BACKGROUND OF THE INVENTION

1. Field of the Invention

This invention relates generally to the circuit architecture of non-volatile memory devices, and more particularly to architecture of the sense amplifier and non-volatile memory cell array of DRAM-like non-volatile memory devices.

2. Description of Related Art

In the semiconductor industry, generally there are two important types of CMOS memories. One type is a volatile memory in which the stored data are not retained when its power supply is removed or shut down. The volatile memories include Static Random Access Memory (SRAM) and Dynamic Random Access Memory (DRAM). The other type is a non-volatile memory (NVM) in which the stored data can normally be retained for more than 20 years even after the power supply voltage source is completely disconnected.

Today, there are many different kinds of NVM memories aimed for different applications. For example, the most popular NVM today is NAND flash with a very small cell size of about $4\lambda^2$ ($\lambda^2$ being the smallest area in the design rule for a given semiconductor process) and is generally used to store huge blocks of data necessary for audio and video serial applications. The second popular NVM is NOR flash with one-transistor cell of about $10\lambda^2$ and is used to store program codes. The third type of NVM is 2-transistor (2T) floating gate tunneling oxide (FLOTOX) electrically erasable programmable read only memory (EEPROM) with a cell size of about $80\lambda^2$. Unlike NAND and NOR flash memories that only allow big-block data alterability, EEPROM can achieve the largest number of program/erase (P/E) cycles. In the current design, the EEPROM is capable of 1 million (1M) P/E cycles when it is operated in units of bytes for small data change applications.

Traditionally, a real byte-alterable operation of FLOTOX-based EEPROM memory array is divided into two steps. The first step is to carry out a Fowler-Nordheim (FN) byte-erase operation and then followed by executing a second step of a FN byte-program operation. Typically, in the traditional FLOTOX-based EEPROM cell, a byte-erase operation is designed to apply a +16.0V to the poly2 gates and 0V to the tunneling channels of the floating-gate transistors in the selected byte of the EEPROM memory array. With the 16.0V voltage across a tunneling oxide layer between the poly1 floating gate and the channel region in a P-substrate, a FN-tunneling effect on the EEPROM cell is induced, thus increasing the threshold voltage (Vt) of each cell to a preferred value of above +4.1V, which is referred to as Vt1 and electrically designed to bias the EEPROM cell in a non-conduction state for storing a binary data of "1" in a byte-read operation. The reason that the threshold voltage increases in each cell of the selected byte after a successful byte-erase operation is because the required number of electrons have been successfully injected into the floating-gate storage layer from the respective channel region due to the occurrence of a FN-tunneling effect.

In contrast, a FN byte-program operation is designed to apply +16.0V to the channel regions along with the floating gates biased at 0V to induce a reverse FN tunneling. How many channels are coupled to the programming voltage of +16.0V depends on the number of cells selected for data change from "1" to "0" during the byte-program operation. In a normal byte-program operation, the number of EEPROM bits selected for a data change varies flexibly from 1 to 8 in a selected byte. A successful byte-program operation decreases the threshold voltages of the selected cells from the high-erased value Vt1 of +4.1V to a lower value below −1.6V, which is referred to as Vt0 and designed to bias the EEPROM cell in a conduction state for storing a binary data of "0". After performing the successful byte-program operation, the stored electrons in the floating-gate of each selected cell are expelled out from the floating-gate layer to the respective channel region.

A completion of a successful byte-write operation means that the EEPROM cells in a selected byte have gone through both successful byte-erase and byte-program operations regardless of their initial threshold voltages being Vt1 or Vt0. Both byte-erase and byte-program operations employ the low-current FN channel tunneling scheme and are performed in unit of byte, which is why the EEPROM memory is referred to as byte-alterable EEPROM. In real embedded EEPROM applications, page-alterable functions combined with byte-alterable functions have been extensively used to meet the specification of 1M endurance cycles under a wide temperature range from −45° C. to +85° C. of the industrial specification.

As it is well known in the EEPROM art, EEPROM cells have an issue in the closure of the threshold voltage gap (Vt-gap) between the high-erased Vt1 and the low programmed Vt0 after a large number of endurance cycles of operation. The high Vt1 of an erased cell would decline but the low Vt0 of a programmed cell would increase after repeated program and erase cycles under all temperature operation, regardless whether the EEPROM device is of the commercial specification (−30° C. to 75° C.), industrial specification (−40° C. to 85° C.) or military (auto) specification (−50° C. to 125° C.).

The Vt-gap closure issue is getting much more severe when the EEPROM devices are operating in a higher temperature environment. The traditional EEPROM byte-alterable array and sense amplifier design have been proven no longer secure and valid to guarantee normal operation with 1M P/E endurance cycles under such a demanding environment. As a result, in order to meet the requirement of 1M or more P/E endurance cycles in unit of byte for high temperature 125° C. specification, new memory architecture needs to be designed to overcome the issue of Vt-gap closure.

In the prior art, one approach proposed to make EEPROM devices work properly in the 125° C. temperature environment is to use an error correction code (ECC) circuit and an algorithm that adds several syndrome bits to each regular byte with an error-correcting capability for the EEPROM data. But under such a high-temperature operating condition, the added syndrome bits of the ECC circuit itself cannot solve the fundamental Vt-gap closure issue of the EEPROM cells after a large number of endurance cycles because the associated traditional EEPROM sense amplifier cannot work with such a narrowed Vt-gap value. As a result, even with the added ECC circuit in the traditional EEPROM device, the failure rate is still high after a large number of repeated P/E cycles in a high-temperature environment.

The traditional EEPROM design is aimed to meet approximately 1.0V Vt-gap goal in normal temperature specification. Therefore, adding the ECC circuit to the traditional EEPROM cell array without fundamental circuit and array design change, the highly stringent specification requirement in auto-grade or military environments still can not be met. There is a strong need in designing an EEPROM device that can work properly even when the Vt-gap has been narrowed down to a very small value in a high temperature environment

SUMMARY OF THE INVENTION

The present invention is designed to overcome the drawback of the conventional EEPROM device that can no longer work when the Vt-gap has been narrowed to a smaller value after a long period of program and erase cycles or in a high temperature environment. A number of DRAM-like EEPROM cell and array structures along with a novel two-level sense amplifier design are provided in the present invention to solve the afore-mentioned Vt-gap closure issue under an extreme temperature condition.

Accordingly, the present invention provides a 4T FLOTOX-based DRAM-like EEPROM cell array. Each 4T FLOTOX-based DRAM-like EEPROM cell comprises a pair of two 2T FLOTOX-based EEPROM cells configured with separate bit lines for two complementary data. The program and erase operations are based on the FN tunneling effect and the byte-alterable write function of the traditional EEPROM memory is also provided. The 4T FLOTOX-based DRAM-like EEPROM cell array and the two-level sense amplifier of the present invention are designed to work properly with a reasonable read speed below a few micro second range even when the Vt-gap is being narrowed down to as small as 5 mV in an extreme 125° C. temperature environment.

An object of the present invention is to provide a 4T FLOTOX-based fully symmetric DRAM-like EEPROM cell structure that uses low-current FN-channel tunneling scheme for performing both program and erase operations similar to the traditional 2T FLOTOX-based EEPROM cell. Each 4T DRAM-like EEPROM cell comprises one pair of 2T FLOTOX-based EEPROM cells configured with two separate and complementary bit lines and two separate and complementary source lines. The paired 2T EEPROM cells of each 4T DRAM-like EEPROM cell are two separate floating-gate devices designed to store two complimentary binary data so as to improve threshold voltage sensing margin during a read operation under a high temperature working environment at the expense of a larger silicon area because of using one pair of 2T EEPROM cells for each 4T DRAM-like EEPROM cell to store only one bit of data.

It is also an object of the present invention to provide a 4T FLOTOX-based fully symmetric DRAM-like EEPROM cell array structure that comprises a plurality of paired 2T FLOTOX-based EEOROM cells organized in a plurality of rows and columns with byte-alterable functions similar to the traditional EEPROM memory but has superior endurance cycles in unit of byte and page even under a high temperature auto-grade environment.

A further object of the present invention is to provide a 4T FLOTOX-based fully symmetric DRAM-like EEPROM cell array structure that comprises a plurality of paired 2T FLO-TOX-based EEOROM cells organized in a plurality of rows and columns with bit-alterable functions and superior endurance cycles in unit of bit under a high temperature auto-grade environment.

It is a further object of the present invention to provide a 4T FLOTOX-based fully symmetric DRAM-like EEPROM cell array in which each byte of 4T DRAM-like EEPROM cells comprises eight bit lines connected to the respective drains of the first eight 2T FLOTOX-based EEPROM cells, eight source lines connected to the respective sources of the first eight 2T FLOTOX-based EEPROM cells, eight complementary bit lines connected to the respective drains of the second eight 2T FLOTOX-based EEPROM cells, and another eight complementary source lines connected to the respective sources of the second eight 2T FLOTOX-based EEPROM cells in addition to one bit line coupled to one common gate of the sixteen 2T FLOTOX-based EEPROM cells through a high voltage (HV) NMOS gate-select transistor. All bit lines, source lines, and complementary bit lines and source lines are preferably running in parallel in y-direction and are perpendicular to word lines and common gate signals running in x-direction. There is no common source line in x-direction.

Yet a further object of the present invention is to provide a 4T FLOTOX-based fully symmetric DRAM-like EEPROM cell array in which the number of bit lines and complementary bit lines are identical to the number of source lines and complementary source lines. Each bit line and complementary bit line are connected to the paired drain nodes of each 4T DRAM-like EEPROM cell and the corresponding source line and complementary source line are connected to the respective source nodes of the 4T DRAM-like EEPROM cell organized in a vertical column. All bit lines, complementary bit lines, source lines and complimentary source lines in the array are vertical metal lines perpendicular to the plurality of horizontal poly word lines in the layout of the byte-alterable DRAM-like EEPROM array of the present invention.

Another object of the present invention is to provide two stored complementary Vt values of each paired 2T EEPROM cells in each 4T FLOTOX-based fully symmetric DRAM-like EEPROM cell. The two complementary Vt values Vt1 and Vt0 of the paired EEPROM cells of each 4T DRAM-like EEPROM cell may be both positive or one positive and one negative. In other words, one embodiment of the preferred Vt1 is kept as a positive value greater than 0V, while the preferred Vt0 value is kept as a negative value less than 0V. In another embodiment, both Vt1 and Vt0 are positive but Vt1 is kept larger than Vt0 with a desired margin greater than 5 mV at the end of a long period of endurance cycles and under a high-temperature working environment.

It is another object of the present invention to provide a two-level sense amplifier design for the DRAM-like NVM device. The first level sense amplifier comprises a pair of voltage-followers and the second level sense amplifier comprises a 6-transistor (6T) cross-coupled latch-type DRAM-like sense amplifier.

A further object of the present invention is to provide the circuit of the first level sense amplifier using the scheme of a pair of voltage-followers with four outputs connected to respective bit lines, complementary bit lines, source lines and complimentary source lines of a pair of 2T EEPROM cells of each 4T DRAM-like EEPROM cell. Each of the pair of voltage-followers comprises two separate outputs arranged in two separate vertical bit lines, one common input voltage coupled to the common vertical source lines and two control signals.

It is yet a further object of the present invention to provide the circuit of the second level sense amplifier that comprises a cross-coupled latch circuit made with 3 PMOS and 3 NMOS transistors configured with a common-source PMOS device and a common-source NMOS device with two complementary control latch signals. The circuit of the second level sense amplifier has two inputs for detecting the voltage difference generated by a pair of voltage-followers of each 4T DRAM-like EEPROM cell.

Another object of the present invention is to provide a preferred method of performing a byte-write operation for the 4T FLOTOX-based byte-alterable DRAM-like EEPROM cell array of the present invention. The byte-write operation of the present invention comprises a first step of performing a byte-erase operation collectively on the selected eight 4T DRAM-like EEPROM cells of the selected byte to increase the threshold voltages of the corresponding sixteen 2T EEPROM cells to a desired high erased value followed by a second step of performing a byte-program operation to lower the threshold voltages of the selected 2T EEPROM cells of the eight 4T DRAM-like EEPROM cells to a desired lower programmed value.

A further object of the present invention is to provide two different methods for the page-write operation of the 4T FLOTOX-based DRAM-like EEPROM array. The page-write operation is divided into two steps. The first step is to perform the page-erase operation to increase Vt of all selected cells to the desired Vt1 and then automatically followed by the second step of a page-program operation which is then further divided into two sub-steps to lower the Vt of the selected cells from Vt1 to Vt0 with the complementary data of the 4T DRAM-like EEPROM cells. In one method, the odd or even half-page is programmed and program-verified immediately before the other even or odd half-page is programmed. In the other method, program-verification of each half-page is performed only after both odd and even half-pages are programmed.

It is still a further object of present invention to provide a preferred method of performing a bit-write operation for the 4T FLOTOX-based bit-alterable DRAM-like EEPROM cell array of the present invention. The bit-write operation of the present invention comprises a first step of performing a bit-erase operation on the selected 4T DRAM-like EEPROM cell of the selected bit to increase the threshold voltages of the corresponding 2T EEPROM cells to a desired common higher erased value followed by a second step of performing a bit-program operation to lower the threshold voltage of the selected 2T EEPROM cell of the 4T DRAM-like EEPROM cell to a desired lower programmed value.

In order to meet the 1M endurance cycle specification of the conventional 2T byte-alterable FLOTOX-based EEPROM, the preferred erase methods of the present invention cover single bit-erase, single byte-erase, page-erase and even chip-erase operations. Normally, the erase speed has to be kept identical for both byte-erase and page-erase operations because of using the low-current FN tunneling scheme. Although each 4T DRAM-like EEPROM cell has one pair of 2T floating-gate storage cells to store two complementary threshold voltage values, it is erased to the same data with high threshold voltage value after a bit-erase, byte-erase or page-erase operation of the present invention.

It is another object of the present invention to provide a preferred method of performing a byte-program operation for the 4T FLOTOX-based byte-alterable DRAM-like EEPROM cell array of the present invention. In order to meet the 1M endurance cycle specification of the conventional 2T byte-alterable FLOTOX-based EEPROM, the preferred program methods of the present invention cover both byte-program and page-program operations using the FN tunneling scheme. Normally, the program speed has to be kept identical for both byte-program and page-program because of the low-current FN tunneling scheme. The paired 2T EEPROM cells of a 4T DRAM-like EEPROM cell have to be programmed with complementary data. In reality, one selected cell out of the paired 2T EEPROM cells is programmed with a lower threshold voltage value in the defined program time.

It is also an object of the present invention to extend the architecture of the 4T FLOTOX-based DRAM-like EEPROM array and the associated two-level sense amplifier to the memory array of flash cells. In other words, each 4T FLOTOX-based DRAM-like EEPROM cell can be replaced by a 4T flash cell comprising a pair of 2T flash cells to form a 4T DRAM-like flash cell array, replaced by a 2T flash cells comprising a pair of 1T flash cells to form a 2T DRAM-like flash cell array, or replaced by two paired 1.5T split-gate flash cells to form a 3T DRAM-like split-gate flash cell array. The two-level sense amplifier scheme that includes a first level of a pair of voltage followers and a second level of a 6T latch-type DRAM-like sense amplifier can be similarly employed in the DRAM-like flash cell array with the similar objectives. The flash cells of the DRAM-like flash cell array of the present invention can be made of PMOS or NMOS, 2-poly floating-gate type flash cells or 1-poly charge-trapping type flash cells of any possible flash technologies.

The present invention discloses several preferred embodiments of nT DRAM-like NVM array architecture that comprise a plurality of paired DRAM-like NVM cell units with two complementary data stored in two separate bit lines and each cell unit having a 2T EEPROM cell, a 2T flash cell, a 1.5T split-gate cell or a 1T NOR flash cell. The NVM array is configured like a DRAM array. Because the operation of all DRAM-like NVM arrays are similar, the following description for the cell array, sense amplifier and control signals only focus on the 4T DRAM-like FLOTOX-based EEPROM array as examples for simplicity.

The foregoing and other features, aspects and advantages of the present invention will become better understood from a careful reading of a detailed description provided herein below with appropriate reference to the accompanying drawings.

BRIEF DESCRIPTION OF THE DRAWINGS

FIG. 4 shows a table that contains two logical states assigned with two binary data "1" and "0", to two Vt states of a 2T FLOTOX-based EEPROM cell.

FIG. 5 shows a table that contains four logic states of each 4T DRAM-like EEPROM cell comprising one pair of 2T FLOTOX-based EEPROM cells of the present invention in which two logical states are assigned with binary data "1" and "0".

DETAILED DESCRIPTION OF THE INVENTION

Figure 1A:
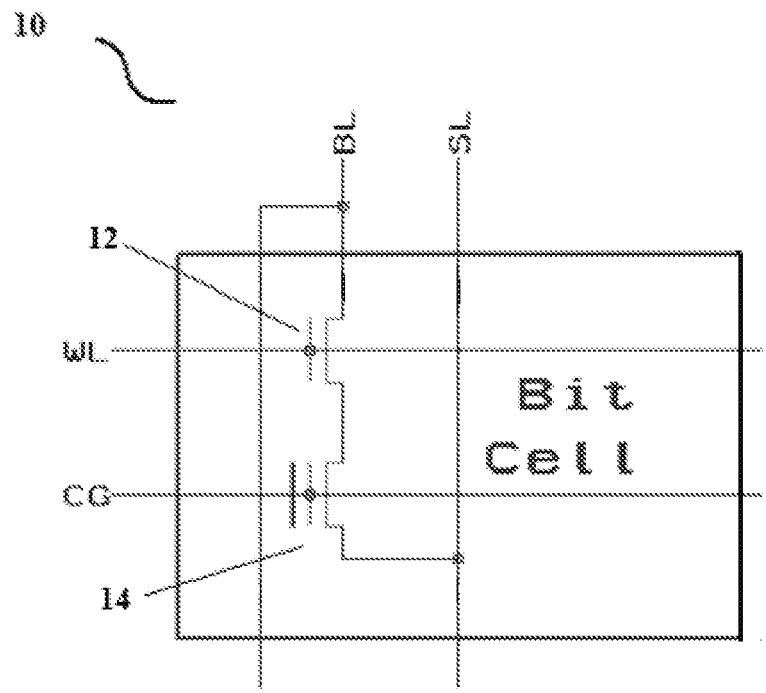
FIG. 1A shows a preferred embodiment of a circuit of a 2T FLOTOX-based EEPROM cell for the 4T DRAM-like EEPROM cell of the present invention.

FIG. 1A shows a preferred embodiment of a unit circuit of a 2T FLOTOX-based EEPROM cell 10 for the 4T DRAM-like EEPROM cell array of the present invention. In a traditional 2T FLOTOX-based EEPROM cell, a drain node is connected to a metal bit line BL running in a vertical y-direction, a source line SL is running in a horizontal x-direction in parallel to a common word line WL and a common gate line CG running in the horizontal x-direction. In the 2T FLOTOX-based EEPROM cell of the present invention, the drain node is still connected to a metal BL running in a vertical y-direction but the SL is also running vertically in parallel with the BL in the y-direction. As a result, both BL and SL of each EEPROM cell of the present invention are running with different metal lines in the y-direction and are arranged perpendicular to WL and CG of the cell that are running in the horizontal x-direction.

As shown in FIG. 1A, each 2T EEPROM cell comprises two high voltage (HV) NMOS transistors electrically connected in series. These two NMOS transistors include a top 1T which is a 1-poly select transistor 12 referred to as ST and a bottom 1T which is a 2-poly floating-gate storage transistor 14 referred to as FT, i.e., the floating-gate storage cell. Because the source line SL of each EEPROM cell is running vertically, a byte of an EEPROM cell array of the present invention does not have a common source line which is physi-cally laid out in the x-direction between eight adjacent cells in the byte structure of a traditional EEPROM cell array. According to the present invention, every EEPROM cell in a column has its own independent BL and SL so that their respective voltages can be flexibly adjusted during a program operation.

During a byte-program operation, eight respective BLs of a selected byte of a 2T EEPROM cell array are coupled to a HV of around 16.0V if all the data are to be changed from "1" to "0". It means that the threshold voltage Vt of each cell will be changed from an initial erased voltage Vt1 of about +4.1V to a desired programmed voltage Vt0 of about −1.6V. The SL node can be flexibly coupled to either a floating voltage or a preferred voltage $V_{SL}$ which can be in a range below +7.0V to dramatically reduce the voltage drop across BL and SL to 9V of the selected cell. Because there is no common source line, the voltage increase in the SL node will automatically stop the further leakage from BL if there is any BL leakage to SL due to the scaling down of the cell channel. As a result, the program voltage 16.0V of BL can be safely retained to ensure the success of the program operation.

The byte structure of the present invention provides an important advantage over the byte structure of the traditional EEPROM cell array that has a common source line between eight physically adjacent cells. The common source line is connected to all SL lines of the whole array which has a high capacitance. In the case of any leakage from the selected BL to SL of one cell, the voltage at the common source line would increase very slowly because of the capacitance that is many-folds higher than the capacitance of the SL of the present invention. As a result, the 16V program voltage of BL would not be retained and would be pulled low to a ground level which would then fail the program operation. The program failure would become even more severe when the EEPROM memory is used in a high-temperature environment such as 125° C. due to higher leakage and weaker current supply from a regular charge-pump circuit design.

Figure 2:
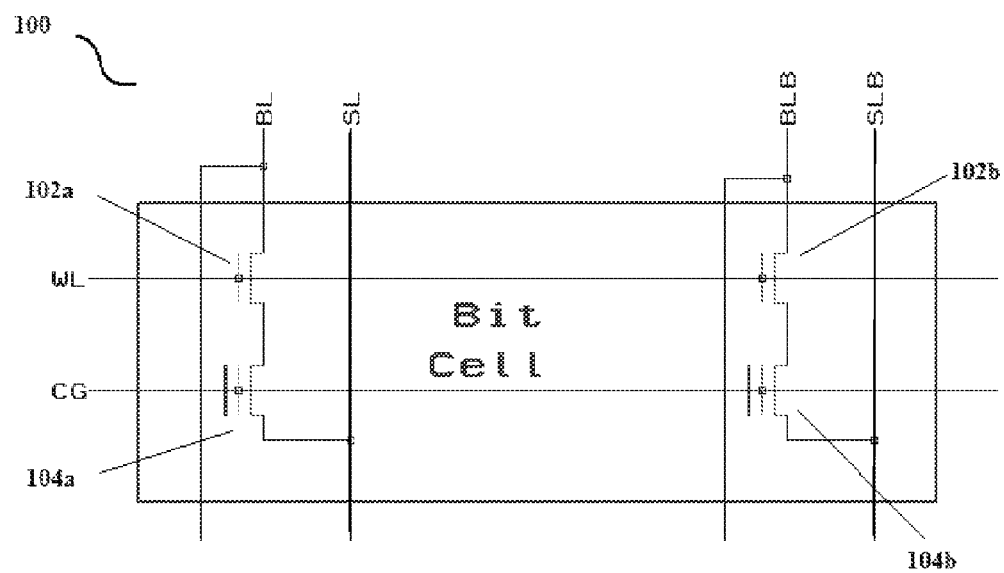
FIG. 2 shows the detailed circuit of a one bit of a 4T DRAM-like EEPROM array comprising a pair of 2T EEPROM cells according to the present invention.

In the preferred embodiment of a 4T DRAM-like EEPROM array of the present invention, a pair of 2T FLO-TOX-based EEPROM cells of FIG. 1A are used in a single bit of the memory array as shown in FIG. 2. Each 4T FLOTOX-based EEPROM cell 100 has two complementary bit lines BL and BLB, and two complementary source lines SL and SLB along with the common WL and CG in the byte structure of the cell array. BL and BLB are preferably coupled to two inputs of a DRAM-like sense amplifier during read via several-level column decoders such as YA and YB. SL and SLB are preferably connected to a desired $V_{SL}$ that acts as the drain of a preferable voltage-follower of the first level sense amplifier of the present invention. SL and SLB are connected to the preferred read, program and erase voltages respectively though a column-decoder in accordance with the present invention. WL is coupled to the output of a row-decoder, while CG is coupled to an output of a common byte-gate select transistor.

Figure 1B:
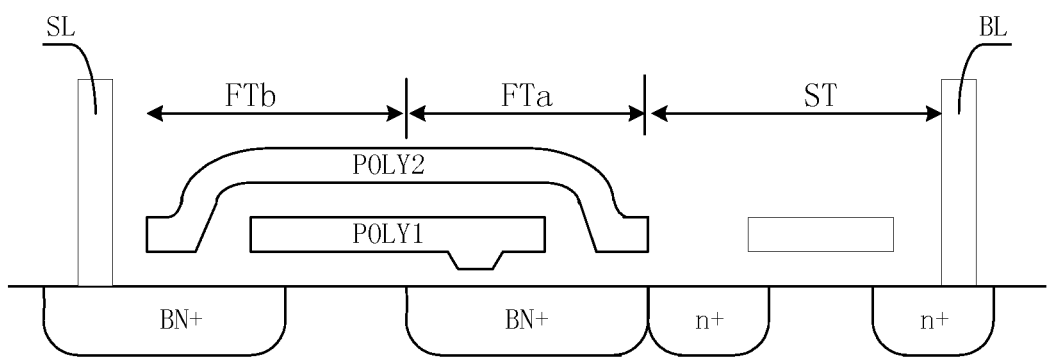
FIG. 1B shows the cross-sectional view of the structure of the 2T FLOTOX-based EEPROM cell of FIG. 1A of the present invention.

FIG. 1B shows the cross-sectional view of the structure of the 2T FLOTOX-based EEPROM cell of FIG. 1A. With a closer look of FIG. 1B, it can be seen that the 1T FT cell 14 of FIG. 1A virtually comprises two 2-poly floating-gate NMOS stack-gated transistors Fta and Ftb that are electrically connected in series. The first 2-poly transistor FTa is located on top with its drain node connected to BL. This FTa is a thin tunnel-oxide 2-poly transistor and its tunnel-oxide is surrounded by BN+ with enough enclosure for performing high-quality FN program and erase operations. The second 2-poly transistor FTb has a thick floating-gate located near SL node, sharing an un-accessible poly1 floating-gate layer and an accessible poly2 control-gate layer with FTa. In a traditional EEPROM array, the channel lengths of both FTa and FTb have to be made large enough to avoid the 16.0V punch-through voltage across BL and SL of a selected 2T EEPROM cell during the program operation because SL is connected to a common source line with a high capacitance. In the 4T DRAM-like EEPROM cell array of the present invention, the respective voltages of SL, SLB, BL and BLB for any 4T cell in the selected byte can be flexibly and independently coupled to the desired voltages below 7V. As a result, the leakage in BL and BLB is less a concern and the success rate of the program operation is significantly improved even under the higher temperature environment at 125° C. Therefore, the channel lengths of both FTa and FTb can be reduced, and the size of each cell and array block can be further reduced when the size of the EEPROM array is scaled down for die cost reduction.

FIG. 2 shows the detailed circuit of a one bit 100 of a 4T DRAM-like FLOTOX-based EEPROM array comprising a pair of 2T FLOTOX-based EEPROM cells according to the present invention. The two 2T EEPROM cells are preferably configured with respective bit lines BL, BLB and respective source lines SL, SLB to make a fully symmetrical 4T DRAM-like cell. BL and SL of the left 2T EEPROM cell are preferably configured with BL and SL running in parallel in the vertical direction. Similarly, BLB and SLB of the right 2T EEPROM cell are configured with the same layout. As a result, each 4T DRAM-like EEPROM cell of the present invention comprises four transistors including a poly1 select transistor ST 102a in series with a 2-poly floating-gate storage transistor FT 104a of the left 2T EEPROM cell and a poly1 select transistor ST 102b in series with a 2-poly floating-gate storage transistor FT 104b of the right 2T EEPROM cell.

The drain node of the poly1 transistor 102a is connected to BL and the source node of the 2-poly transistor 104a is connected to SL. The drain node of the poly1 transistor 102b is connected to BLB and the source node of the 2-poly transistor 104b is connected to SLB. Both poly1 gates of the select transistors 102a and 102b of the 4T DRAM-like cell are connected to a common word line denoted as WL. The gates of the 2-poly floating-gate storage transistors 104a and 104b are connected to a common gate line denoted as CG. CG is the common gate line of the sixteen 2-poly FT transistors of 16 EEPROM cells of a byte of the 4T DRAM-like EEPROM cell. The 4T DRAM-like EEPROM cell requires twice the silicon area as compared to a traditional 2T EEPROM cell but provides significantly better Vt sensing margin under an extreme operating environment such as 125° C. to meet the stringent program/erase endurance requirement of more than 1 million cycles.

Figure 3:
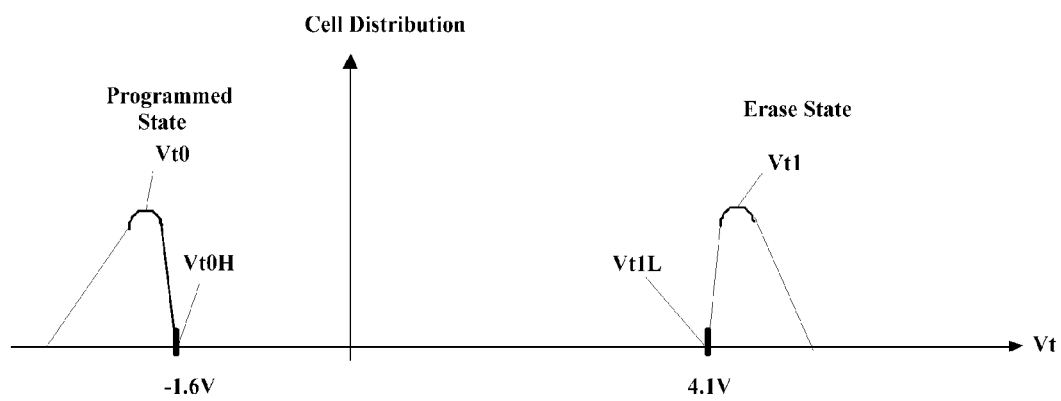
FIG. 3 shows the Vt distributions of each FLOTOX-based 2T 2-poly floating-gate storage transistor shown in FIG. 1A.

FIG. 3 shows Vt distributions of each FLOTOX-based 2T 2-poly floating-gate storage transistor 14 shown in FIG. 1A which is used as the 2-poly floating-gate storage transistors 104a and 104b shown in FIG. 2 of each 4T DRAM-like EEPROM cell. The low Vt state Vt0 has a preferable maximum programmed value Vt0H of −1.6V. The high Vt state Vt1 has a preferable minimum erased value Vt1L of +4.1V. In the 4T DRAM-like EEPROM cell, Vt1 is the erased state, while Vt0 is the programmed state. In the 2T EEPROM storage cell of FIG. 1A, each cell stores either Vt0 or Vt1. In the 4T DRAM-like EEPROM cell in FIG. 2, when the floating-gate storage transistor 104a stores Vt0, the corresponding floating-gate storage transistor 104b would preferably store Vt1. On the contrary, when the floating-gate storage transistor 104a stores Vt1, the floating-gate storage transistor 104b would preferably store Vt0.

This arrangement of complementary Vt storage is similar to how DRAM or SRAM stores the complementary data on a paired bit lines. The disadvantage is that each 4T DRAM-like EEPROM cell can only store one equivalent bit of binary data in the present invention. Vt0 with a preferable maximum value of −1.6V and Vt1 with a preferable minimum value of +4.1V are the initial values of a 4T DRAM-like EEPROM cell before a lengthy endurance test. Typically, after a long period of P/E cycles, the final values of Vt0 and Vt1 would be merged to a value around the intrinsic Vt of the 2T EEPROM cell which may be around +1.0V.

FIG. 4 shows a table that contains two binary data assignments, "1" and "0", to two Vt states of a 2T FLOTOX-based EEPROM cell that is used to construct the 4T DRAM-like EEPROM cell in accordance with the present invention. Vt1 is the erased state and is typically assigned with a binary data of "1", while Vt0 is the programmed state and assigned with a binary data of "0". Normally, Vt1 is designed with a preferably positive value greater than −4.1V but Vt0 is designed with a preferably negative value below −1.6V. In the traditional EEPROM write operation, an erase operation is performed collectively on a selected byte or a selected page first to erase Vt of every cell to Vt1 and then followed by a program operation to change Vt of the selected cell from Vt1 to Vt0 in accordance with the desired data pattern. The erase operation is to inject the plurality of electrons into the selected floating gates of the FT transistors of the selected byte or page collectively based on the FN tunneling effect. Normally, the total required time for the erase and program operations is about 1 mini-second in the typical EEPROM product design.

FIG. 5 shows another table that contains one preferable option of two binary logic state assignments to two of the four combinations of Vt states of each pair of 2T EEPROM cells of a 4T DRAM-like EEPROM cell of the present invention. These two assigned logical states are two useful states. The Vt states of the two assigned logic states can be arbitrarily swapped without a problem. The two unused Vt states are not assigned with any binary data and are referred to as State-1 and State-0. State-1 is a state defined as when Vt of both FT 104a and 104b transistors are storing the high Vt state Vt1. On the contrary, State-0 is defined as when Vt of both FT 104a and 104b floating-gate transistors are storing the low-Vt state Vt0.

According to the present invention, the erase-state which is preferably assigned a binary data of "1" and is defined as when FT 104a floating-gate transistor stores Vt1, while FT 104b floating-gate transistor stores the complementary Vt0 in the paired EEPROM cells. The program-state which is assigned a binary data of "0" is defined as when the FT 104a floating-gate transistor stores Vt0, while the FT 104b floating-gate transistor stores Vt1 in the paired EEPROM cells. The "0" and "1" of the logic assignments can be switched without a problem in the present invention.

Figure 6:
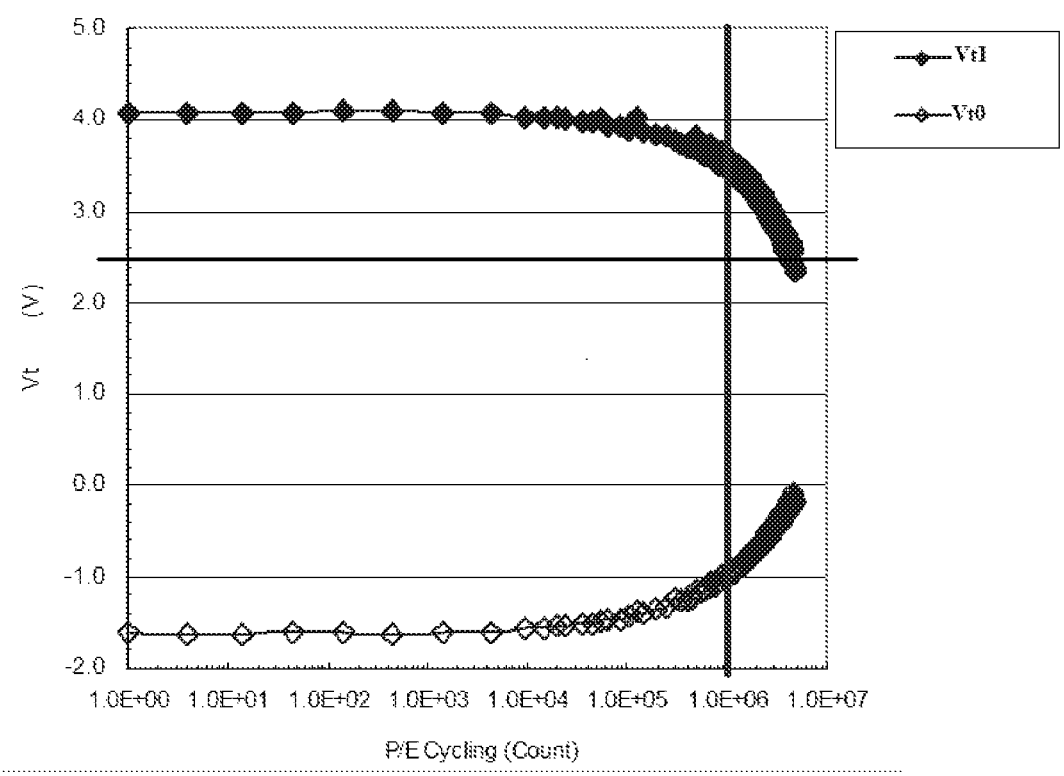
FIG. 6 shows the Vt-gap closure effect after a large number of program and erase cycles.

FIG. 6 shows a graph that indicates Vt-gap closure effect after a long period of program and erase cycles. The high threshold voltage Vt1, on the top of graph is the erased-Vt that starts with an initial value of +4.1V in the beginning of the long endurance cycle test. The low threshold voltage Vt0, on the bottom of graph is the programmed-Vt that starts from −1.6V in the beginning of the long endurance cycle test. The Vt-gap between Vt1 and Vt0 in the beginning is wide open with a value of about 5.7V before performing the lengthy endurance test. That means the Vt-gap voltage can be maintained at the largest value of 5.7V at first cycle of the endurance test.

As can be seen from the graph after 1M program and erase cycles, the High Vt1 drops to a lower value of around +3.5V and continues to drop to a further lower value of +2.5V after about 6 million cycles. On the contrary, the low Vt0 increases to a value from initial −1.6V to a higher value of about −1.0V after one million endurance cycles and then continues to increase to a further higher value of 0V after about 6 million cycles. The Vt-gap between high Vt1 and low Vt0 in the beginning of the endurance cycle test is about 5.7V and then it narrows down to a smaller voltage value of about 2.5V after 6 million cycles. This Vt-gap narrowing effect is typically referred as the Vt-gap closure effect in the long endurance cycle test of the traditional EEPROM and flash cells. One of the key causes of the Vt-gap closure is due to lots of charge trappings in the tunneling oxide layer between the poly1 floating-gate and the channel region of the FT transistor of the EEPROM cell during the large number of program and erase cycles. The graph of the Vt-gap closure shown in FIG. 6 was from endurance cycle test done in a room ambient environment which is about 27° C. In higher temperature such as 85° C. or even 125° C., the Vt-gap closure speed will become more severe before 1M cycles.

In order to have a sensing margin in a read operation, the common CG voltage of the selected byte is required to be set at a value in-between the final Vt1 and Vt0. In the 4T DRAM-like EEPROM cell of the present invention, the Vt-gap voltage is aimed to meet the specification of around 5 mV when the sensing speed specification is in a few micro second range under a 125° C. high-temperature environment. For those read speed specifications defined as few hundreds of nano second, the Vt-gap voltage is designed to meet the specification of about 100 mV.

Figure 7A:
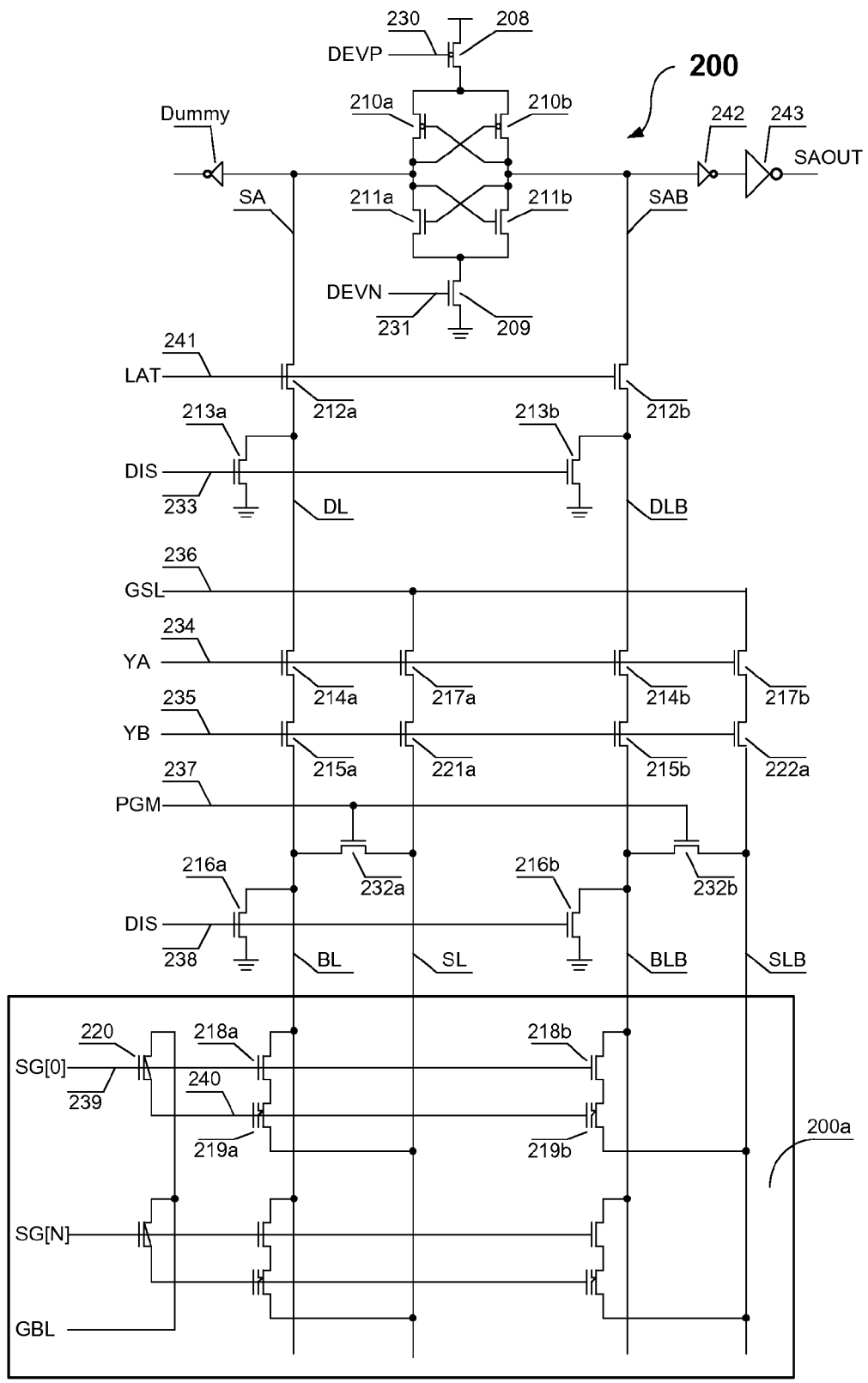
FIG. 7A shows an exemplary circuit of one column of the 4T DRAM-like FLOTOX-based EEPROM array and the associated two-level sense amplifier of the present invention in which each 4T FLOTOX-based EEPROM cell comprises a pair of 2T FLOTOX-based EEPROM cells.

FIG. 7A, shows an exemplary circuit 200 of one column of the 4T DRAM-like FLOTOX-based EEPROM array of the present invention. One column of the 4T DRAM-like EEPROM cell array comprises a plurality of paired 2T EEPROM cells organized in two separate cell columns with four vertical metal lines BL, BLB, SL and SLB. The DRAM-like EEPROM array is aimed to provide the identical byte-alterable storage function along with a goal of meeting a large number of endurance cycles of 1M under a high temperature 125° C. environment. Furthermore, the page-alterable function can also be achieved by cascading a plurality of bytes in a common row as in the traditional 2T EEPROM cell array.

In the byte-alterable DRAM-like EEPROM array structure, each byte comprises eight bit lines BLs, eight complementary bit lines BLBs, eight source lines SLs, eight complementary source lines SLBs, and a gated bit line GBL which controls the common gate 240 of a selected byte. For a byte-read operation, 8 BLs and 8 complementary BLBs from 8 selected 4T DRAM-like EEPROM cells are coupled respectively to the two inputs of eight 6T latch-type sense amplifiers on top through several level column decoders YA and YB of the selected byte from a selected row SG[N].

The respective voltages at paired BL and BLB of a selected 4T DRAM-like EEPROM cell are two outputs of one pair of voltage-followers that comprise a pair of 2T EEPROM cells (218a/219a and 218b/219b) gated by the common signal CG 240, with paired SL and SLB coupled from a common power source voltage GSL 236. BL and BLB are connected to the inputs of the column decoders YA, YB. The outputs of the column decoders YA, YB are the two data lines DL, DLB to the corresponding 6T sense amplifier. Two pairs of NMOS devices (214a/215a and 214b/215b) respectively couple BL and BLB to DL and DLB.

The 6T latch-type DRAM-like sense amplifier comprises 6 transistors including two cross-coupled PMOS devices 210a and 210b, two cross-coupled NMOS devices 211a and 211b, a common source NMOS transistor 209 gated by a common signal DEVN 231 and a common source PMOS transistor 208 gated by a common signal DEVP 230. The latch-type sense amplifier has two inputs SA and SAB coupled to drains of the PMOS devices 210a, 210b and NMOS devices 211a, 211b, and three common control signals LAT 241, DEVN 231 and DEVP 230. SA and SAB are developed into SAOUT which is the output of the inverter 243. Before a new sensing cycle, the selected paired bit lines BLs and BLBs, data lines DLs and DLBs, sensing nodes SA and SAB of each sense amplifier have to be discharged to ground level for preparing to sense the new differential voltage values at SA and SAB nodes that are generated from the paired voltage-followers on the newly selected 4T DRAM-like EEPROM cell in the new read cycle of the present invention.

According to the present invention, the 4T DRAM-like EEPROM array is configured to have a common signal CG 240 connected to sixteen floating-gate transistors of the eight 4T DMAM-like EEPROM cells of a selected byte. The common signal CG 240 is coupled to the source node of a HV NMOS CG-select transistor 220. The drain node of the CG-select transistor 220 is coupled to a common vertical gated bit line GBL. In the 4T DRAM-like EEPROM cell array of the present invention, each byte has 8 BLs, 8 BLBs, 8 SLs, 8 SLBs and one GBL. In other words, there are 17 vertical bit lines and 16 vertical source lines in a byte of 4T DRAM-like EEPROM cells. In the conventional 2T FLOTOX-based EEPROM cell array, there are only 9 bit lines running vertically and one common source line running horizontally in parallel to WL and CG of each byte.

Three key operations of a bit of a 4T DRAM-like EEPROM cell include bit-program, bit-read and bit-erase. The byte-read, byte-program and byte-erase operations of the cell array illustrated in FIG. 7B cover eight single bits of FIG. 7A with identical operations. A complete bit-write cycle starts from a FN bit-erase operation and then automatically followed by a FN bit-program operation in the 4T DRAM-like EEPROM cell array. The following will describe the bit-erase, bit-program and bit-read operations of FIG. 7A according to the present invention. The byte-write, byte-erase, byte-program and byte-read operations for the byte-alterable EEPROM array of the present invention can be easily extended in accordance with FIG. 7B.

During the bit-erase operation, the gate of the selected FT has to be coupled to a high voltage of 16V along with 0V in the channel region of the selected FT. In FIG. 7A, a pair of FT devices 219a and 219b of two 2T EEPROM cells are selected for the bit-erase operation. The gates of the two FT devices 219a and 219b are connected to the common signal CG 240. The channel regions of the paired FT transistors 219a and 219b are coupled to SL and SLB respectively. During the bit-erase operation, the common signal CG 240 is preferably coupled with a HV around +16V along with 0V on both SL and SLB. After a defined bit-erase time of around 1 mini-second, the electrons in the channel regions of the two selected FT transistors 219a and 219b would be attracted and injected into the respective floating-gate layers. As a result, the threshold voltages of both FT transistors 219a and 219b would be increased to a desired high value Vt1 that is above +4.1V as shown in FIG. 3, and both FT devices 219a and 219b of the 4T DRAM-like EEPROM cell would have a same Vt1 state which is the defined "NA" logical state shown in FIG. 5. "NA" state cannot be used in the read operation of the present invention.

The common signal CG 240 of 16V for the voltages of the two selected FT gates in the bit-erase operation is coupled from the gated bit line GBL through a selected pass-transistor which is a HV native NMOS device 220. In order to have 16V on CG 240, GBL has to be coupled to 16V along with 16V on SG[0] 239. In this example, the first row of SG[0] is selected, and therefore the remaining SG[N] has to be coupled to 0V to shut off the remaining rows in the cell array 200a.

SL and SLB for the bit-erase operation of the two selected FT devices are coupled to 0V from the common power source voltage GSL 236 through column decoders YA and YB. The SL voltage is coupled through NMOS select transistors 217a and 221a, while the SLB voltage is coupled through NMOS select transistors 217b and 222a. Both signals 234 and 235 for the column decoders YA and YB have to be coupled to a power supply voltage VDD with a voltage condition larger than the voltage required for the power source of the paired voltage-followers made of 219a and 219b. During the bit-erase operation, BL and BLB are preferably also coupled to 0V. In other words, during the bit-erase operation, all BL, BLB, SL and SLB are preferably coupled to 0V along with 16V on CG 240 for a proper FN erase operation of the selected FT cells 219a and 219b.

During the bit-program operation, the gates the selected FT transistors have to be coupled to 0V along with 16V in the channel regions. As shown in FIG. 7A, a pair of FT devices of two 2T EEPROM cells are selected for the bit-program operation. In the bit-program operation, the common signal CG 240 is preferably coupled with 0V along with 16V on both BL and BLB and around 7V on SL and SLB to reduce the punch-through voltage across over the channel between BL and SL or between BLB and SLB depending on the desired digital data. In order to have 0V on common signal CG 240, GBL signal has to be coupled to 0V along with 16V on SG[0] 239. Because the first row SG[0] is the selected one in the example, the remaining SG[N] has to be coupled to 0V to shut off the other rows in the cell array of 200a.

The 16V on either BL or BLB for the bit-program operation of the two selected FT gates is coupled from two outputs of a page-buffer which is not shown in FIG. 7A. Assuming that the logic state of "1" is desired for the bit-program, the left FT cell 219a needs to keep Vt1 of the erased Vt and the right FT cell 219b has to be selected for changing its Vt from Vt1 to Vt0 for the desired logic state "1" of the bit-program. In this case, BL has to be coupled to 16V along with SL being couple to 7V, and BLB and SLB are coupled to 0V respectively. Therefore, GSL is coupled to 0V and YA and YB have to be coupled to VDD, while the common signal PGM has to be coupled to a voltage of 7V+Vt, where Vt is the threshold voltage of the NMOS device 232a or 232b.

During the bit-program operation, signals DIS 233 and LAT 241 should be held at ground level to isolate the low voltage devices of the 6T sense amplifier from the HV that may occur on BL, BLB, SL and SLB in the cell array. Similarly, the 6T sense amplifier should be disabled by pulling the signal of DEVP 230 to VDD and the signal of DEVN 231 to ground to save power consumption.

After about 1 mini-second time of the bit-program operation with the logic-state of "1", Vt0 of the left FT device 219a and Vt1 of the right FT device 219b are read back for the bit-program verification by connecting BL and BLB to SA and SAB of the 6T sense amplifier respectively. The bit-program verification is similar to the bit-read operation that will be explained below in details. In the logic state of "1" data, the voltage of SA would be developed to VDD and the voltage of SAB would be 0V. As a result, the output voltage of SAOUT after the two inverters 242, 243 should be at a voltage level VSS for the bit-program of the logic state of "1" to pass the verification.

On the contrary, if the desired program pattern is the logic state of "0", the left FT cell 219a would be programmed with a low value Vt0, while the right FT cell 219b would keep the high erased Vt1. As a result, the voltage of SA would be developed to the level VSS, while the voltage of SAB would be developed to VDD. Therefore, the output voltage of SAOUT would be VDD after the logic state of "0" is successfully programmed.

After a defined bit-program time of around 1 mini-second, the electrons in one of the channel regions of the two selected FT transistors, i.e., the channel region of either the FT device 219a or the FT device 219b, would be expelled out from the floating-gate layer into the channel region. For example, for the logic state of "1" data, the electrons on the floating-gate of the left FT 219a is kept unchanged but the electrons in the floating-gate of the right FT 219b would be expelled out to decrease its threshold voltage to the low level Vt0. In contrast, for the bit-program operation of the logic state of "0", the electrons on the left FT 219a would be expelled out to decrease its threshold voltage to the low level Vt0, while the electrons on the floating-gate of the right FT 219b would be kept unchanged after the bit-program operation.

During the bit-read operation, the final Vt difference between the stored Vt1 and Vt0 of the FT devices 219a and FT 219b in the selected 4T DRAM-like EEPROM cell is read out from the cell array 200a onto SA and SAB of the 6T latch-type sense amplifier shown on the top of FIG. 7A. The voltages coupled to SA and SAB reflect 100% of the Vt difference of the paired FT devices 219a and 219b because the voltage-follower scheme is used as a first-level sense amplifier, and the 6T latch-type sense amplifier is the second level sense amplifier of the present invention. The voltage-followers convert the complementary Vt1 and Vt0 stored in FT devices 219a, 219b to $V_{CG}$-Vt1 and $V_{CG}$-Vt0 on SA and SAB respectively under the condition that SA and SAB are discharged to 0V initially to avoid any false reading, where $V_{CG}$ is the voltage of the common gate CG 240. The DC voltage difference between Vt1 and Vt0 would be 100% truly reflected on SA and SAB without degradation in accordance with the principle of the voltage-follower circuit operation.

According to the present invention, in order to have a proper bit-read operation of the 4T DRAM-like EEPROM array, the operation can be divided into three steps including discharging, charging and development.

In the discharging step, the paired high-capacitance bit lines BL and BLB are discharged to ground level by pulling the signal of DIS 238 to VDD by turning on to both NMOS devices 216a and 216b. Similarly, the signal of DIS 233 is also pulled to VDD to discharge both DL and DLB to ground level by turning on another paired NMOS devices 213a and 213b. The discharging step is used to prepare for the next charging step by the paired voltage-followers which are made of the paired FT devices 219a and 219b. It is preferred that the discharging step is initiated once the previous read cycle is latched before next address transition. Therefore, when the new addresses are changed to address the new memory location of the selected cells, the charging step can be carried out immediately without waiting for the completion of the discharging step so that the speed of memory access can be dramatically improved.

In the discharging step, the common signal GSL 236 is pulled high to VDD. YA-select transistor 217a and YB-select transistor 221a are turned on by pulling YA 234 and YB 235 to full VDD voltage. As a result, the SL and SLB voltages are both at VDD-Vt, where Vt is the threshold voltage of the NMOS transistors 217a and 221a. When VDD is 1.8V, VDD-Vt is about 1.0V at both SL and SLB if CG 240 is held at ground level.

Only one of the selected paired lines, i.e., either BL or BLB is charged up to reduce current consumption. In the mean time, the selected CG 240 is applied with a preferred read voltage $V_{CG}$ which must be equal to or less than the voltage $V_{SL}$ of SL and the voltage $V_{SLB}$ of SLB, which are both at the voltage level VDD-Vt, to ensure the proper operation of the voltage-follower. As described above, the paired EEPROM FT cells 219a and 219b, must be programmed with complementary Vt0 and Vt1. The preferred $V_{CG}$ can be set at different values as long as the condition of $V_{CG} \leq V_{SL}$ or $V_{CG} \leq V_{SLB}$ is met, where $V_{SL} = V_{SLB} = $VDD-Vt in this case. In the lower VDD operation such as 1.8V, $V_{SL}$ and $V_{SLB}$ can be set at VDD, i.e., $V_{SL} = V_{SLB} = $VDD to achieve a larger operating range and a bigger sensing margin.

In some worse cases, if the threshold voltages Vt0 and Vt1 of the two FT devices 219a and 219b drop to less than $V_{CG}$ after a large number of P/E cycles, both BL and BLB would be charged up to the voltage values of $V_{CG}$-Vt1 and $V_{CG}$-Vt0 respectively when the stored data in the FT devices 219a and 219b is the logic state of "1". Similarly, BL and BLB would be fully charged up to the voltage values of $V_{CG}$-Vt0 and $V_{CG}$-Vt1 respectively when the stored data in the FT devices 219a and 219b is the logic state of "0". The gap of the threshold voltage Vt-gap becomes a small value Vt1−Vt0 which is the sensing margin of the 6T latch-type sense amplifier. In theory and in reality, the smallest Vt-gap can be as small as 5 mV if the sensing speed is not a concern and the layout and the device match are perfectly achieved in silicon for the voltage-follower and the 6T latch-type sense amplifier of the present invention.

If Vt0 of one FT cell of the two FT devices 219a and 219b is less than $V_{CG}$ but Vt1 of the other FT cell is higher than $V_{CG}$, the FT cell having Vt0 is in the conducting state while the other FT cell is in the shut-off state. As a result, one of BL and BLB is charged up to the voltage value of $V_{CG}$-Vt0, where Vt0 can be a positive or negative value, and the other of BL and BLB is not charged up and remains at 0V resulted from the previous discharging step. The Vt-gap in this case is $V_{CG}$-Vt0, which is a differential voltage larger than the Vt-gap value of Vt1-Vt0 at the two inputs SA and SAB of the sense amplifier.

For example, assuming that Vt0 is −0.5V and Vt1 is +1.0V, the voltage of BL is charged to $V_{CG}$-Vt0=1.0V−(−0.5V)=1.5V if $V_{CG}$ is held at 1.0V while the voltage of BLB voltage is not charged up and remains at 0V. As a result, the voltage difference between SA and SAB would be 1.5V which is a quite large differential voltage to the 6T sense amplifier at the end of the charging step of the present invention. Because 1.5V is a large value, the read speed including the development step can be as fast as less than 100 nano-seconds.

Figure 8:
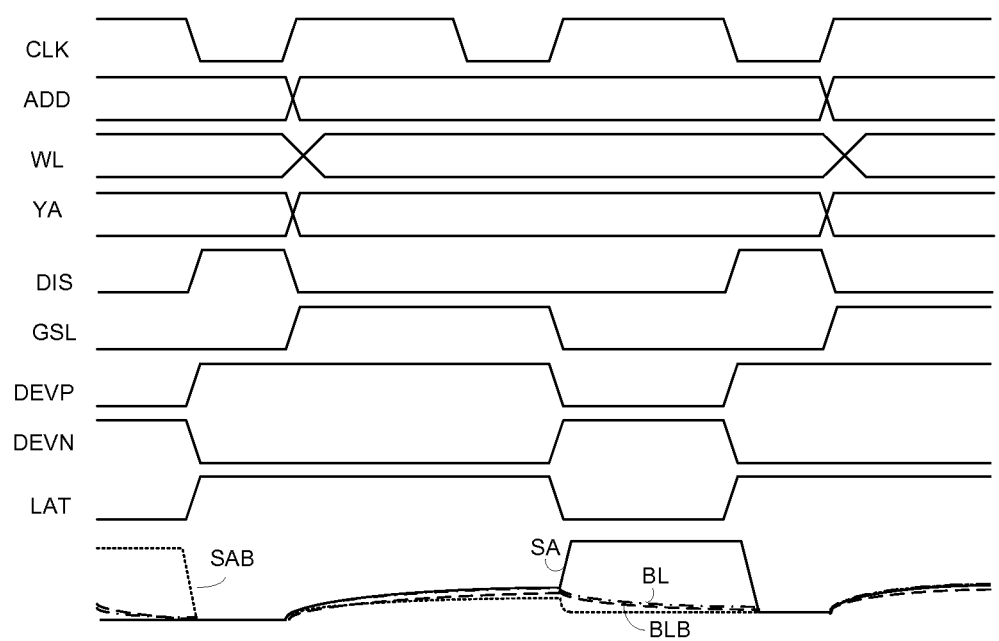
FIG. 8 shows the timing waveforms of the major control signals for the 6T latch-type sense amplifier of the DRAM-like NVM array of the present invention.

In the development step, any small voltage difference between the paired BL and BLB and present at respective inputs SA and SAB of the 6T latch-type sense amplifier is developed by a set of three key control signals DEVP 230, DEVN 231, LAT 241 as shown in FIG. 7A. The waveforms of the control signals are shown in FIG. 8. Right before the development step, the differential voltage $\Delta V_{SA\text{-}SAB}$ which is presented to SA and SAB must be settled first at a full value by the voltage-followers during the charging step. The value of $\Delta V_{SA\text{-}SAB}$ varies from as small as Vt1-Vt0 when both Vt1 and Vt0 are less than $V_{CG}$ to as large as $V_{CG}$-Vt0 when Vt1 ≥ $V_{CG}$. The goal of the development step is to amplify the small $\Delta V_{SA\text{-}SAB}$ of less than VDD to a full VDD and VSS at SA and SAB of the 6T latch-type sense amplifier to provide a larger VDD swing with a larger supply current at the output SAOUT for supporting larger loading.

In the present invention, it is preferred that the development step starts when the differential voltage $\Delta V_{SA\text{-}SAB}$ has been well established at the end of the charging step. The charging step starts from the last latch of the previous cycle and extends to the time when $V_{CG}$ voltage reaches about 1V. It is possible to charge up BL and BLB first and then SA and SAB secondly within a time period less than 50 nano-seconds if the capacitances are small at BL and BLB. If the capacitances are large, the charging time may take from above 100 nano-seconds to a few micro-seconds. In order to have a successful development step, the two inputs SA and SAB of each 6T latch-type sense amplifier must be isolated from the high capacitances at signal lines DL and DLB.

To isolate the inputs SA and SAB of each 6T latch-type sense amplifier from the highly-capacitive DL and DLB, the latch signal LAT 241 is grounded to turn off the paired NMOS devices 212a and 212b. In the mean time, the signal DEVP 230 is used to turn on the PMOS 208 and the signal DEVN 231 is used to turn on the NMOS 209 to enable the 6T latch-type sense amplifier. As a result, the voltage difference of initial $\Delta V_{SA\text{-}SAB}$ which is less than VDD before the development step will be developed or amplified into the full VDD voltage level at the end of the development step. The difference of SA and SAB voltages starts to pull apart once the development step commences. Depending on the initial voltages at SA and SAB of the sense amplifier, one of SA and SAB with a lower initial voltage will be pulled to ground and the other with a higher initial voltage will be pulled to VDD. The design of the 6T latch-type sense amplifier is similar to the traditional DRAM sense amplifier except that the design of the traditional DRAM sense amplifier uses capacitor's charge sharing to generate the initial voltage difference between SA and SAB, while the present invention uses the voltage-follower scheme to generate the initial voltage difference from the paired FT cells that store two complementary Vt0 and Vt1.

In accordance with the present invention, the 4T DRAM-like EEPROM array with the overall sense amplifier that combines voltage-followers as the first level sense amplifier and the 6T latch-type sense amplifier as the second level sense amplifier has several advantages over the conventional EEPROM or flash array with the traditional sense amplifier. First of all, in the traditional sense amplifier, the detectable threshold voltage difference is down to several hundred mV. The present invention can provide superior sensitivity of $\Delta V_{SA\text{-}SAB}$ between BL and BLB or SA and SAB down to around 10 mV with the assumption that all devices of the 6T sense-amplifier are well tracked in the layout and matched in the device parameters. As a result, the 4T DRAM-like EEPROM array with the two-level sense amplifier design offers the correct read operation even when the Vt-gap reduces down to around 10 mV after an extremely tough data retention condition such as 125° C. temperature and 10 years of operation.

Secondly, the two-level sense amplifier allows Vt0 and Vt1 stored in the paired FT cells to vary in a wide range because the 6T latch-type sense amplifier design operates based on the smallest differential voltage Vt1−Vt0 between the two inputs SA and SAB rather than the absolute voltages of Vt1 and Vt0. As long as there is a sufficient voltage difference between SA and SAB, the data can be sensed and fully developed. This allows a very large margin for the threshold voltage of the FT cells to decrease or increase during tough data retention conditions.

Figure 7B:
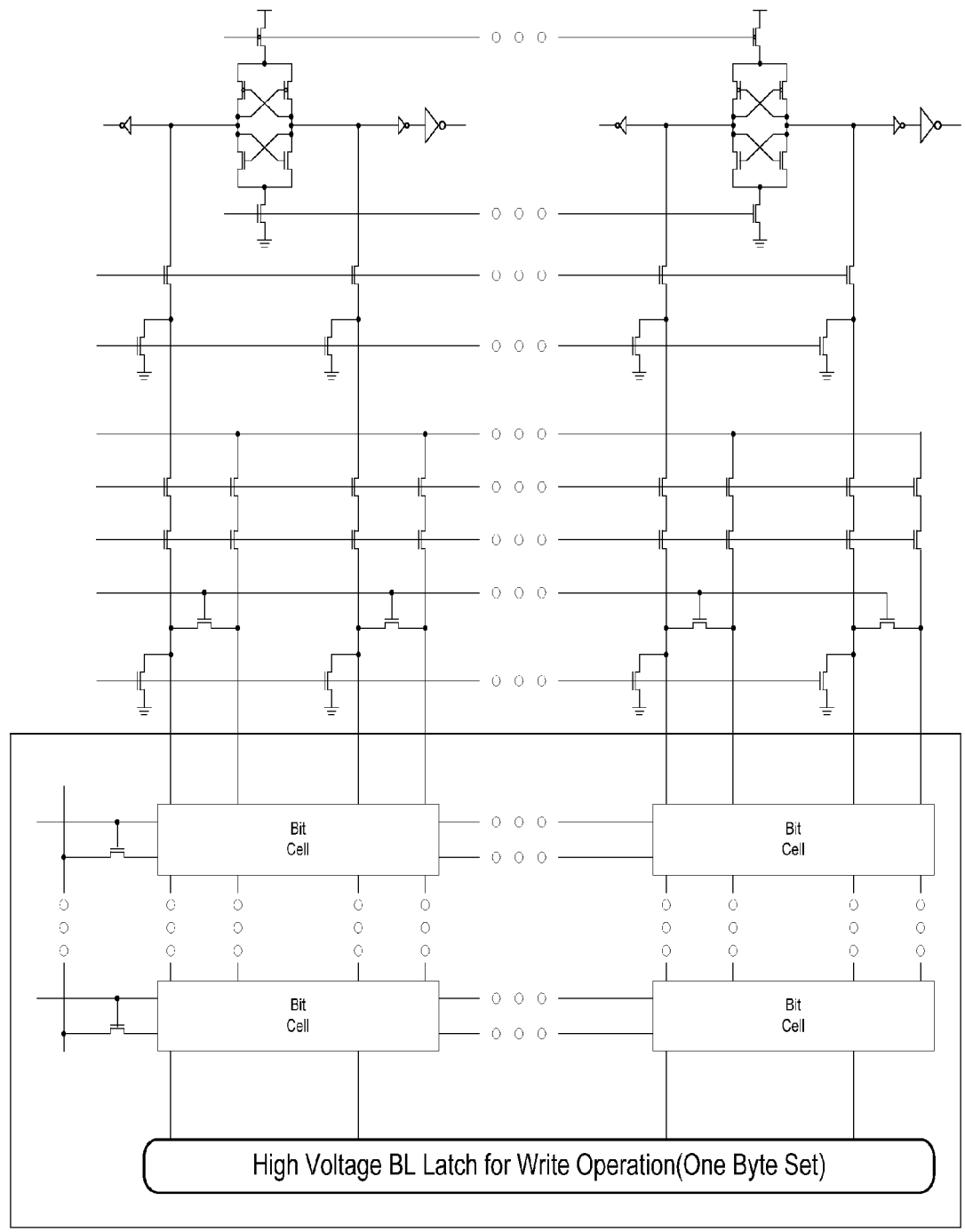
FIG. 7B, shows a byte of a 4T DRAM-like EEPROM cell array comprising eight columns of the 4T DRAM-like FLO-TOX-based EEPROM array of FIG. 7A according present invention.

The bit architecture of the 4T DRAM-like EEPROM array of the present invention as shown in FIG. 7A has been used to describe the design of the memory circuit and the principle of bit operations. FIG. 7B shows the same 4T DRAM-like EEPROM array with a byte architecture in the cell array, eight paired voltage-followers and eight 6T latch-type sense amplifiers along with the same set of control signals LAT, DEVP, DEVN and DIS as well as YA and YB column decoders. The three key byte operations including byte-erase, byte-program and byte-read operations are identical to the bit-erase, bit-program and bit-read operations described previously except that 8 bit operations are performed at the same time and, therefore, the description will not be repeated.

According to the present invention, the reading scheme using the two-level sense amplifier including voltage-followers and a 6T latch-type sense amplifier can also be used in other types of flash memory arrays. FIGS. 7C-7F illustrate several preferred flash array embodiments in accordance with the same design spirit of the 4T DRAM-like EEPROM array of the present invention.

Figure 7C:
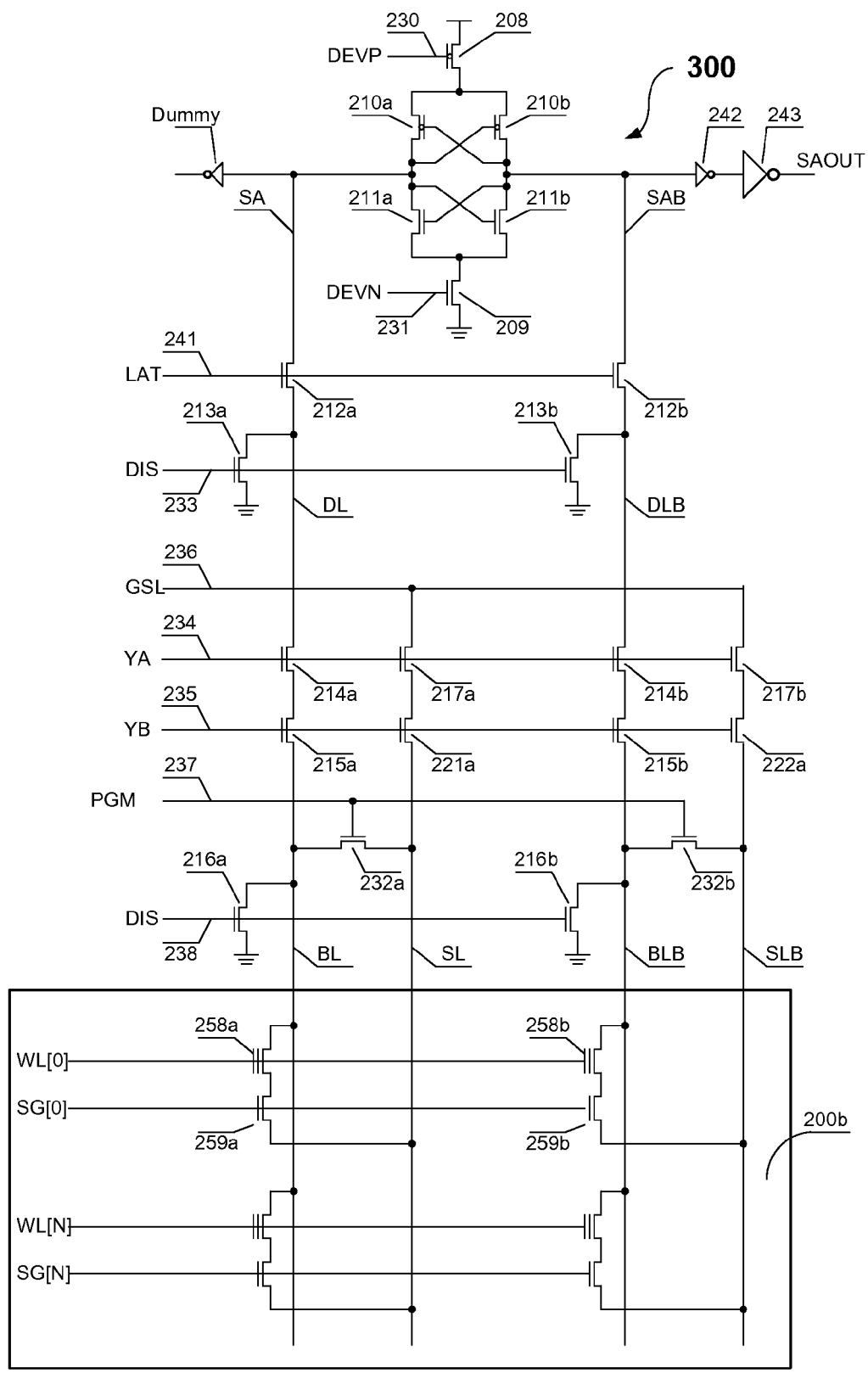
FIG. 7C shows a 4T DRAM-like flash cell array and the associated sense amplifier of the present invention in which each 4T DRAM-like flash cell comprises a pair of 2T flash cells.

FIG. 7C shows the circuit of one column of a 4T DRAM-like flash cell array 300 with the associated sense amplifier of the present invention. The 4T DRAM-like flash cell array 300 is provided with page-alterable functions. Although byte-alterable functions can still be used in the 4T DRAM-like flash cell array 300 but the P/E endurance cycles in unit of byte would be dramatically reduced.

In the flash cell array 200b, each 4T DRAM-like flash cell comprises a pair of 2T flash cells including first 2-poly FT 258a and 1-poly ST 259a, and second 2-poly FT 258b and 1-poly ST 259b. The program and erase operations of the two FT transistors 258a and 258b are similar to the traditional NAND cell. The flash cell is formed in a triple P-well (TPW) within a deep N-Well (DNW) on top of a P-substrate.

During the FN-channel erase operation, a high voltage of +20V is applied to the TPW of the selected cells and the floating gates are grounded. The low-current FN erase operation is aimed to decrease the threshold voltages of the selected cells to a desired low value Vt0, which is a negative value around −2.0V.

In contrast, the FN page-program operation is aimed to increase the threshold voltages of the selected cells to a desired high value Vt1, which is preferably a positive value +2.0V. The page-program operation is performed by applying a high voltage of +20V to the selected WL[n] that is coupled to the common gates of FT transistors 258a and 258b in the flash cell array 200b along with a 0V coupled to TPW of the selected FT transistors. In this embodiment, both ST and FT transistors are formed on the same TPW but poly1 and poly2 are shorted to the poly1-gate in the paired ST transistors 259a and 259b.

The gate voltage of the voltage-follower in this embodiment is the voltage applied to WL[N]. Therefore, the conditions to meet the accurate voltage-follower operation are redefined as follows:

$$V_{WL} \le V_{SL} \text{ or } V_{WL} \le V_{SLB}, \text{ where } V_{SL}=V_{SLB}=VDD-Vt.$$

According to the present invention, to have a proper bit-read of the 4T DRAM-like flash array 300, the operation can still be divided into three steps of discharging, charging and development as previously discussed in the description of FIG. 7A. Because the operations of FIG. 7C are similar to the 4T FLOTOX-based EEPROM array 200 as shown in FIG. 7A except that the cell array is based on 2T flash cells, the details of the description of page-write, page-program, page-erase and byte-read operations are not repeated here.

Figure 7D:
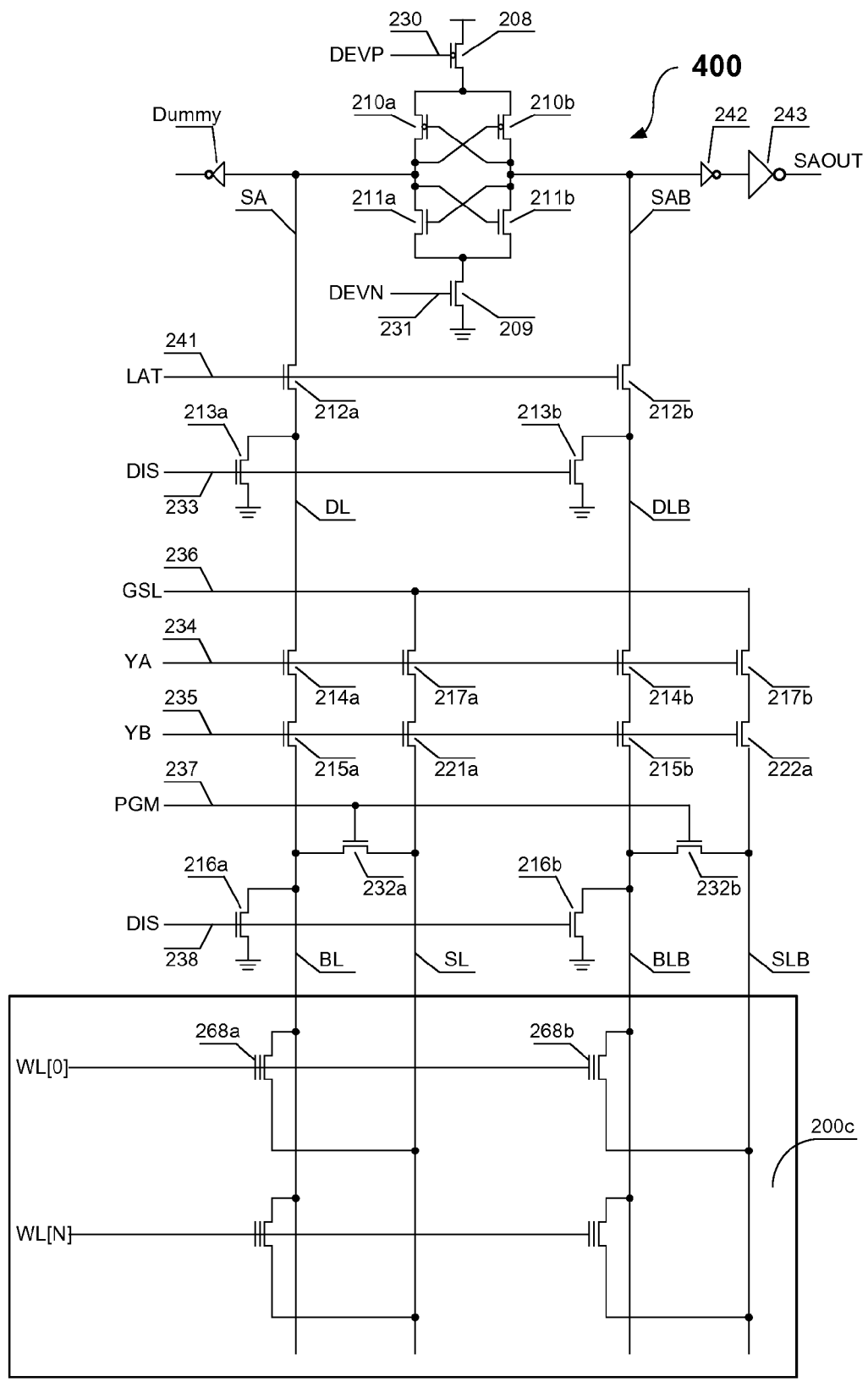
FIG. 7D shows a 2T DRAM-like flash cell array and the associated sense amplifier of the present invention in which each 2T DRAM-like flash cell comprises a pair of 1T flash cells.

FIG. 7D shows the circuit of one column of a 2T DRAM-like flash cell array 400 with the associated sense amplifier of the present invention. The 2T DRAM-like flash cell array 400 is provided with preferable page-alterable functions. Although byte-alterable functions can still be used in the 2T DRAM-like flash cell array 400 but the P/E endurance cycles in unit of byte would be dramatically reduced.

Each 2T DRAM-like flash cell comprises of a pair of 1T flash cells including a first 2-poly FT 268a without a 1-poly ST and a second 2-poly FT 268b without a 1-poly ST in the flash cell array 200c. The program and erase operations of the two FT transistors 268a and 268b are similar to the traditional stack-gated 1T NOR cell. The cell is formed in a triple P-well (TPW) within a deep N-Well (DNW) on top of a P-substrate.

During the FN-channel erase operation, a high voltage of −10V is applied to the floating gates of the selected cells and a high voltage of +10V is applied to the selected TPW to establish an adequate FN tunneling field. As a result of a page-erase operation, the electrons in the floating-gates of the selected FT transistors are expelled out into the channel regions of the FT transistors. The low-current FN erase operation is aimed to collectively decrease the threshold voltages of the selected cells within the selected page or block to a desired maximum value of Vt0 which is around +2.0V. Vt0 minimum is maintained above +0.5V to avoid the over-erase leakage in the bit lines.

In this embodiment, the program operation uses a high-current channel hot electron (CHE) scheme in unit of byte and word. It is aimed to increase the threshold voltages of the selected cells to a desired high value Vt1, which is preferably a positive value greater than +4.0V. According to the present invention, both Vt0 and Vt1 are preferably positive values to avoid false reading.

Similar to FIG. 7C, the gate voltage of the voltage-follower in this embodiment is the voltage applied to WL[N]. The two inputs are the paired SL and SLB. The paired outputs are SA and SAB. Therefore, the conditions to meet the accurate voltage-follower operation are redefined as follows:

$$V_{WL} \le V_{SL} \text{ or } V_{WL} \le V_{SLB}, \text{ where } V_{SL}=V_{SLB}=VDD-Vt.$$

Similarly, to have a proper bit-read of the 2T DRAM-like flash array 400, the operation can still be divided into three steps of discharging, charging and development as previously explained in the description of FIG. 7A. Because the operations of FIG. 7D are similar to the 4T FLOTOX-based EEPROM array 200 as shown in FIG. 7A except that the cell array is based on 2T flash cells, the details of the description of page-write, page-program, page-erase and byte-read operations are not repeated here.

Figure 7E:
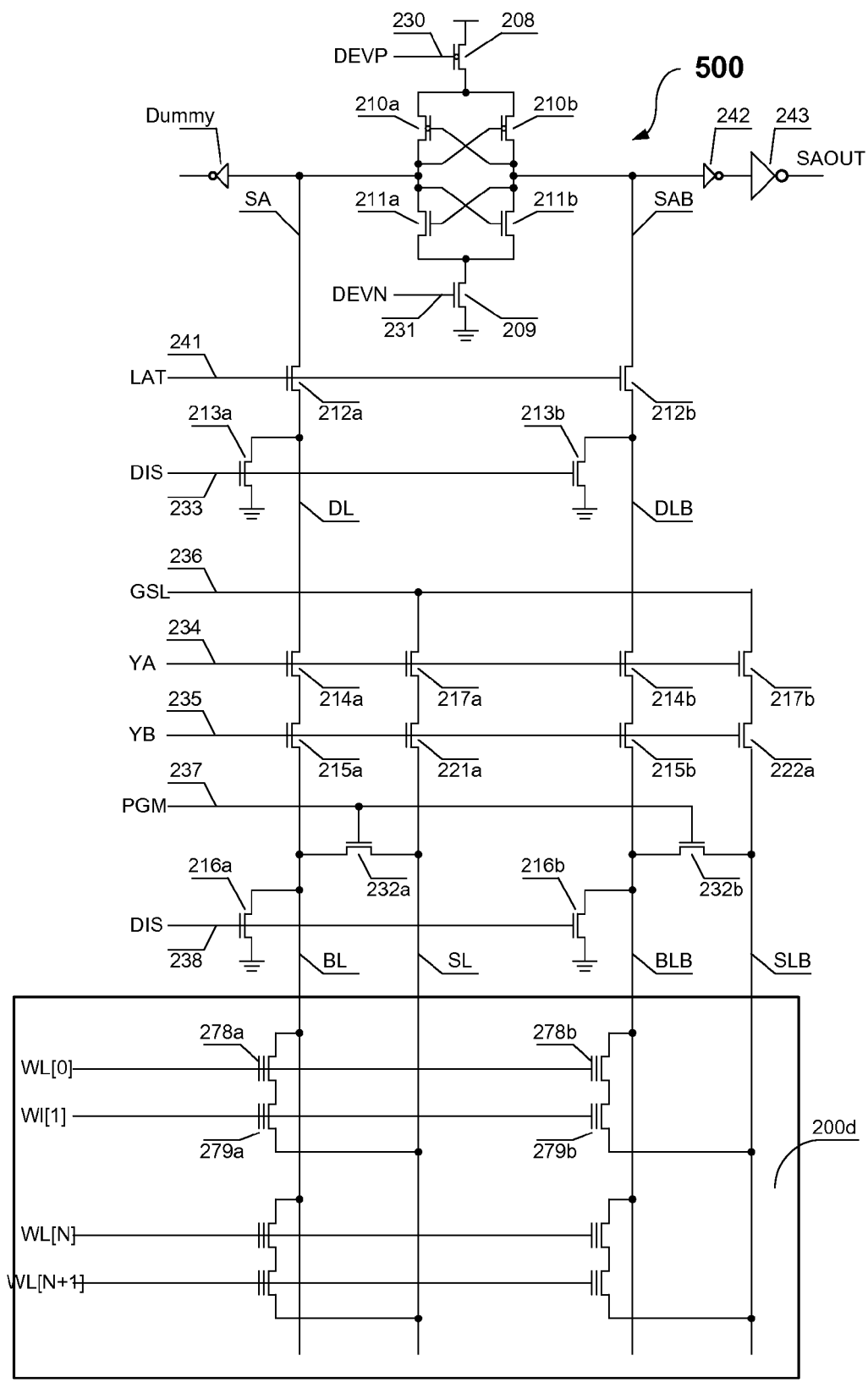
FIG. 7E shows an alternative 4T DRAM-like flash cell array and the associated sense amplifier of the present invention in which each 4T DRAM-like flash cell comprises a pair of 2T flash cells.

FIG. 7E shows the circuit of one column of another 4T DRAM-like flash cell array 500 with the associated sense amplifier of the present invention. The flash cell array 500 is provided with preferable page-alterable functions. Although byte-alterable functions can still be used in the 4T DRAM-like flash cell array 500 but the P/E endurance cycles in unit of byte would be dramatically reduced.

Each 4T DRAM-like flash cell comprises a pair of 2T flash cells including first 2-poly FT 278a and FT 279a and second 2-poly FT 278b and FT 279b. All FT transistors are formed in a TPW within a DNW on top of a P-substrate in the flash array 200d. The low-current FN program and erase operations of the four FTs 278a, 278b, 279a and 279b are the same as the FN program and erase operations of the traditional NAND cell. In this embodiment, there are no ST devices. Each 2-poly transistor can play the role of FT and ST. Thus, the 4T DRAM-like flash cell can store two bits of binary data. In other words, each 4T DRAM-like flash cell in FIG. 7E has twice the storage capacity of a 4T DRAM-like flash cell of FIG. 7C.

The three key operations including byte-erase, byte-program and byte-read are identical to the previous bit-erase, bit-program and bit-read operations described for FIG. 7A except that the operations are in unit of byte rather than bit. Therefore, the detailed description of the operations in FIG. 7E is not repeated here for simplicity.

Figure 7F:
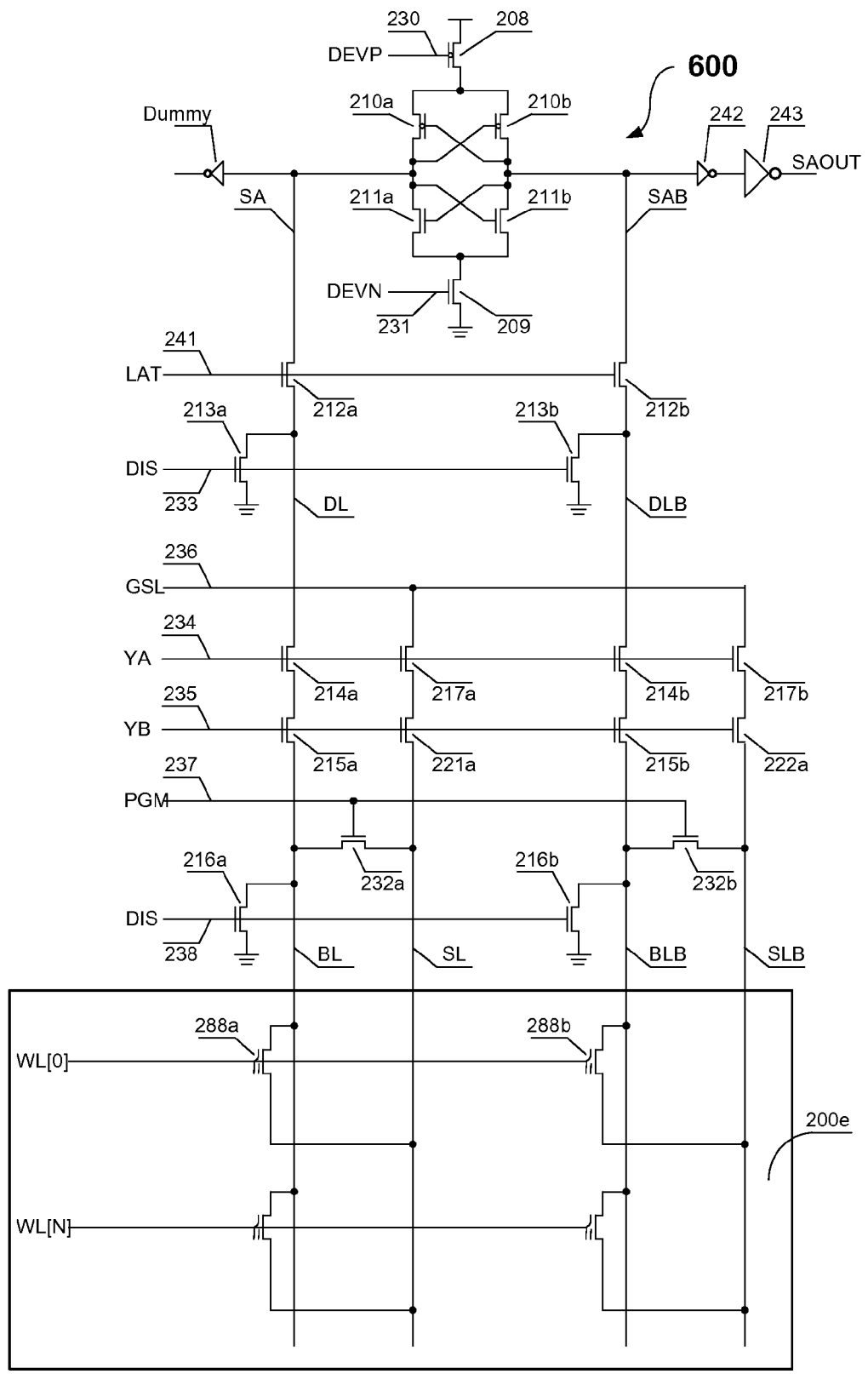
FIG. 7F shows a 3T DRAM-like split-gate flash cell array and the associated sense amplifier of the present invention in which each 3T DRAM-like split-gate flash cell comprises a pair of 1.5 split-gate flash cells.

FIG. 7F shows the circuit of one column of a 3T DRAM-like split-gate flash cell array 600 with the associated sense amplifier of the present invention. The 3T DRAM-like split-gate flash cell array 600 is provided with preferable page-alterable functions. Although byte-alterable functions can still be used in the 3T DRAM-like flash cell array 600 but the P/E cycles in unit of byte would be dramatically reduced.

Each 3T DRAM-like split-gate flash cell comprises a pair of 1.5T split-gate flash cells including a first 2-poly FT 288a and a second 2-poly FT 288b. All FT transistors are formed on top of a P-substrate in the flash cell array 200e. The low-current FN program and erase operations of the FT transistors 288a and 288b are similar to the operations of a traditional split-gate cell array. It should be noted that each split-gate flash cell in this embodiment has one FT device and one ST device but the two devices are physically squeezed into one transistor area. The program operation of this embodiment uses the low-current CHE scheme and is performed in units of bytes or words.

The three key operations including byte-erase, byte-program and byte-read are identical to the previous bit-erase, bit-program and bit-read operations described for FIG. 7A except that the operations are in unit of byte rather than bit. Therefore, the detailed description of the operations in FIG. 7F is not repeated here for simplicity.

According to the present invention, the circuits shown in FIGS. 7C-7F all share the same two-level sense amplifier scheme with voltage-followers and a 6T latch-type sense amplifier as in FIG. 7A. The detailed description of the principle and operations of the two-level sense amplifier scheme of FIG. 7A has been discussed extensively and is not repeated here.

FIG. 8 shows the timing waveforms of the major control signals for the 6T latch-type sense amplifier of the 4T DRAM-like FLOTOX-based EEPROM cell array of the present invention shown in FIG. 7A. The key waveforms from top to bottom include ADD, WL, YA, DIS, SL, DEVP, DEVN and LAT. The address signals ADD include a plurality of row addresses and a plurality of column addresses. From row addresses to WL, it may use several level pre-row decoders. Similarly, the plurality of column addresses typically has several column decoders such as YA for the first level column decoder and YB for the second level column decoder. In a higher density memory array, a third level column decoder YC or a fourth level column decoder YD may be needed. CLK is used for a synchronous read operation. LAT is used to activate SA to further develop the small signal to a full-VDD signal. DEVP is used to activate the two common-source PMOS devices 210a, 210b and DEVN is used to activate the two common-source NMOS devices 211a, 211b of the 6-T cross-coupled sense amplifier of the 4T DRAM-like EEPROM cell array.

Figure 9:
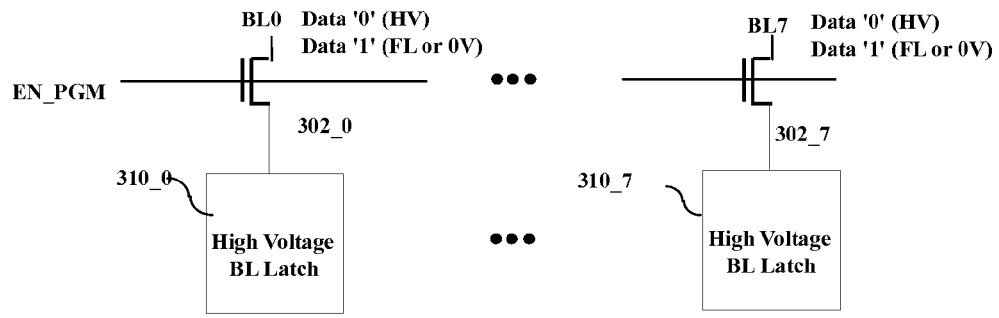
FIG. 9 shows the circuit relationship between the output of each bit of HV latch of a page-buffer and a corresponding BL of the traditional 2T FLOTOX-based EEPROM cell array.

FIG. 9 shows the circuit relationship between the output of each bit of the high voltage latch of a page-buffer and a corresponding BL of the traditional 2T FLOTOX-based EEPROM cell array. The digital data of a page write operation is stored in each bit 310_n of the page buffer through the corresponding BL and one HV NMOS pass-transistor 302_n during a data-loading period. In other words, one bit latch of a page buffer needs one HV NMOS pass transistor per BL for the traditional FLOTOX-based EEPROM array.

Figure 10:
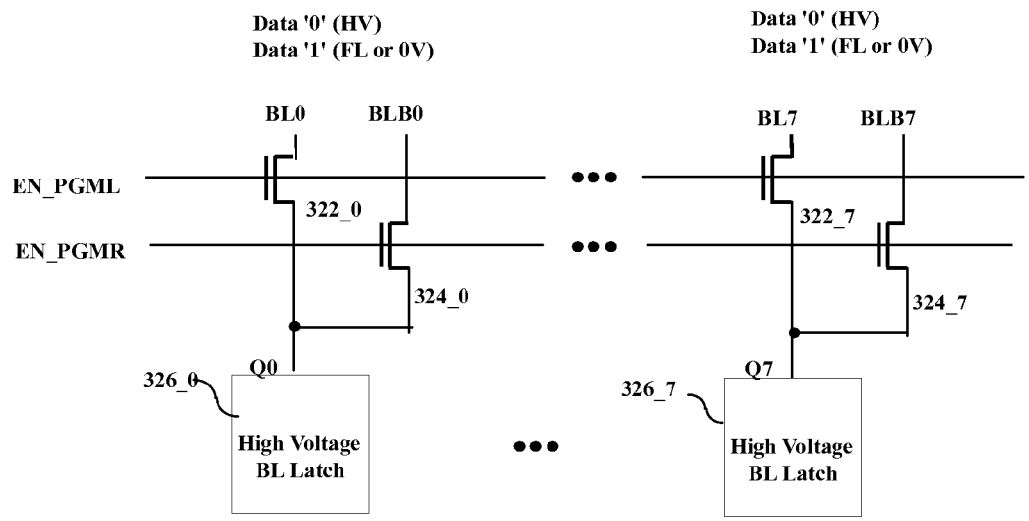
FIG. 10 shows one embodiment of the circuit relationship between the output of each bit of HV latch of a page-buffer and the corresponding BL and BLB of the DRAM-like NVM array of the present invention.

FIG. 10 shows one embodiment of the circuit relationship between the output of each bit of high voltage latch 326_n of a page-buffer and the corresponding BL and BLB of the 4T DRAM-like FLOTOX-based EEPROM cell array of the present invention. The digital data of the page buffer during a page-write operation is stored in each bit 326_n of the page buffer through the corresponding BL and BLB and one pair of HV NMOS pass-transistors 322_n and 324_n sharing one output of high voltage latch 326_n during a data-loading period. In other words, each bit latch of the page buffer has only one output Qn and is coupled to a pair of BLn and BLBn through the paired NMOS pass-transistors 322_n and 324_n for each 4T DRAM-like FLOTOX-based EEPROM cell array of the present invention.

Figure 11:
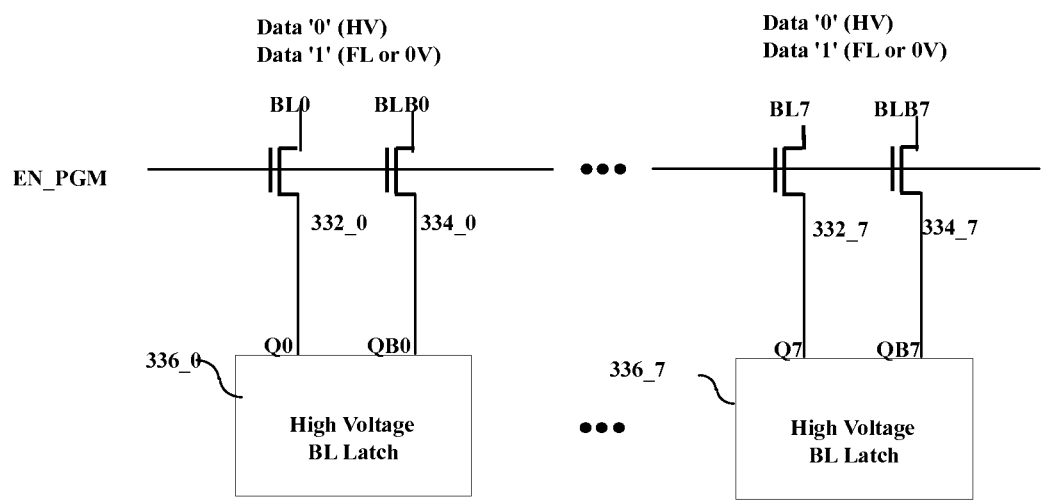
FIG. 11 shows another embodiment of the circuit relationship between the output of each bit of HV latch of a page-buffer and the corresponding BL and BLB of the DRAM-like NVM array of the present invention.

FIG. 11 shows another embodiment of the circuit relationship between the output of each bit of high voltage latch 336_n of a page-buffer and the corresponding BL and BLB of the 4T FLOTOX-based DRAM-like EEPROM cell array of the present invention. The digital data of the page buffer is stored in each bit of the page buffer through the corresponding BLn and BLBn and two HV NMOS pass-transistors 332_n and 334_n during the data-loading period. In other words, each bit latch has two outputs Qn and QBn that are coupled to corresponding BLn and BLBn respectively through two NMOS pass-transistors 332_n and 334_n for each 4T DRAM-like FLOTOX-based EEPROM cell array of the present invention.

Figure 12:
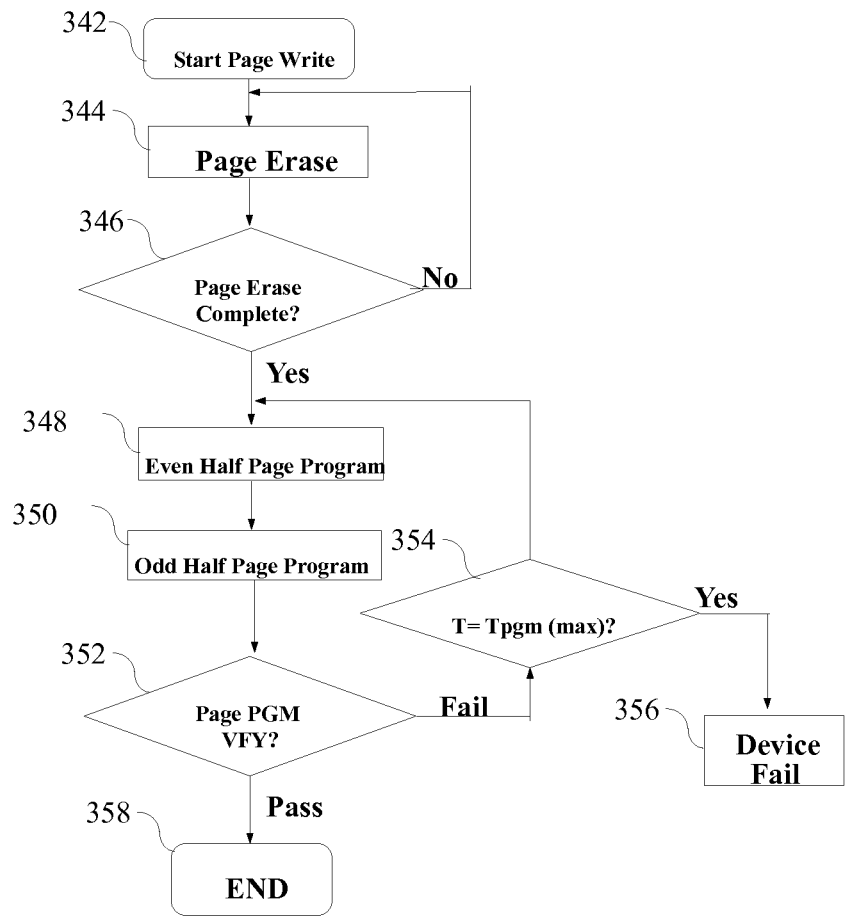
FIG. 12 shows a flow chart of a page-write operation for the DRAM-like NVM array of the present invention.

FIG. 12 shows a flow chart 340 of a page-write operation of the present invention. The page-write operation of the 4T DRAM-like EEPROM cell comprises a first step of a page-erase operation 344 and then followed by a second step of a page-program operation. The page-write operation is automatically controlled by an on-chip state-machine of the present invention. The first step is to erase the flexible number of bytes of a whole selected page within the desired erased time specification of around 1 mini-second. After the success of erasing the flexible number of bytes of the selected page in step 346, the Vt of the selected cells in the selected page are collectively increased to VtH simultaneously within the erased time. Although the page-erase operation can be performed on all the bytes of the whole selected page, the program operation has to be divided into two steps that include a first step 348 of programming the bytes of the odd or even half page and then followed by a second step 350 of programming the other even or odd half page. Program verification 352 is performed after both half pages are programmed. After the successful programming of the whole page, the Vt of the selected cells are lowered from initial VtH to a final lower value of VtL for the desired data pattern for each 4T DRAM-like FLOTOX-based EEPROM cell of the present invention. A complete successful page-write operation means that the page-erase operation and the two half-page program operations are successfully completed. If the page-program operation is not successfully completed within the time limit, the cell memory array is a failed device as shown in steps 354 and 356.

Figure 13:
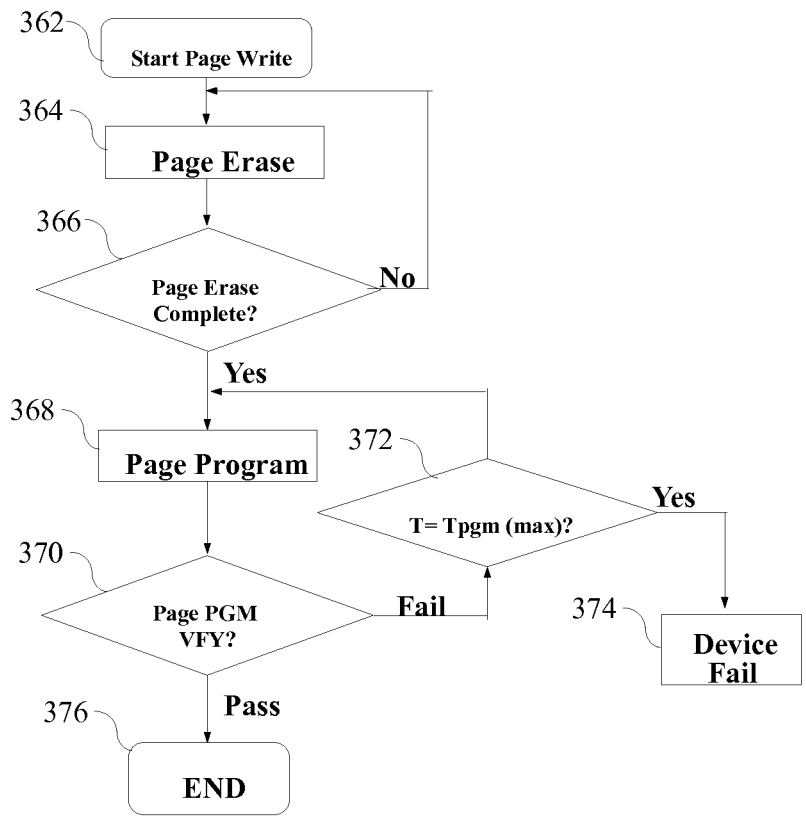
FIG. 13 shows a flow chart of an alternative page-write operation for the DRAM-like NVM array of the present invention.

FIG. 13 shows a flow chart 360 of another embodiment of a page-write operation of the present invention. In this embodiment, the page-write operation of the 4T DRAM-like EEPROM cell also comprises a first step of a page-erase operation 364 and then followed by a second step of a page-program operation. The page-erase operation is identical between FIG. 12 and FIG. 13. After the successful completion of the page-erase operation 366, the page-program operation is subsequently performed on the bytes of the selected page. The bytes of the odd and even half pages are programmed separately by a step 368 of programming one half page followed immediately by a step 370 of program verification. In other words, the first odd or even half page is successfully programmed and verified, and then the other even or odd half page is programmed and verified. Once both half pages complete the program and program verification operations, the page-write operation has been successfully performed and completed 376. If the page-program operation is not successfully completed within the time limit, the cell memory array is a failed device as shown in steps 372 and 374.

Although the present invention has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A DRAM-like non-volatile memory (NVM) array, comprising:
   a matrix of a plurality of NVM cell units arranged in a plurality of rows and columns, each of said NVM cell unit including a first NVM cell device and a second NVM cell device as a pair with each NVM cell device having a drain node and a source node;
   a plurality of word lines, each word line associated with a row of said NVM cell units;
   a plurality of bit line pairs, each bit line pair associated with a column of said NVM cell units, and each bit line pair having a first bit line connected to the drain nodes of the first NVM cell devices in the associated column, and a second bit line connected to the drain nodes of the second NVM cell devices in the associated column, said bit line pairs being laid out perpendicular to said word lines;
   a plurality of source line pairs, each source line pair associated with a column of said NVM cell units, and each source line pair having a first source line connected to the source nodes of the first NVM cell devices in the associated column, and a second source line connected to the source nodes of the second NVM cell devices in the associated column, said source line pairs being laid out perpendicular to said word lines;
   a plurality of column decoders, each column decoder associated with a column of said NVM cell units; and
   a plurality of cross-coupled latch-type sense amplifiers, each latch-type sense amplifier associated with a column of said NVM cell units, each latch-type sense amplifier having symmetric first and second inputs coupled to the first and second bit lines in the associated column through the associated column decoder;
   wherein in each NMV cell unit, the first NVM cell device and the second NVM cell device each have a floating-gate storage cell, and the two floating-gate storage cells are programmed with respective erased and programmed threshold voltages as a pair to store only one bit of binary data.

2. The DRAM-like NVM array according to claim 1, wherein the first and second source lines of each column of said NVM cell units are coupled to a source voltage line through the associated column decoder.

3. The DRAM-like NVM array according to claim 1, wherein in each column of said NVM cell units, the first bit line and the first source line are coupled to a program control signal by a first program signal coupling device, and the second bit line and the second source line are coupled to the program control signal by a second program signal coupling device.

4. The DRAM-like NVM array according to claim 1, wherein each column decoder is a multi-level decoder for coupling the first and second bit lines to the first and second inputs of the sense amplifier in the associated column.

5. The DRAM-like NVM array according to claim 1, wherein each column decoder has two inputs respectively connected to the first and second bit lines of the associated column, and two outputs respectively coupled to two inputs of the associated sense amplifier.

6. The DRAM-like NVM array according to claim 5, wherein each column decoder further has a pair of input discharging devices for respectively coupling the two inputs of the associated column decoder to ground, and a pair of output discharging devices for respectively the two outputs of the associated column decoder to ground.

7. The DRAM-like NVM array according to claim 1, wherein each latch-type sense amplifier is coupled to the associated column decoder by a pair of latch devices controlled by a latch signal to respectively isolate the two inputs of each sense amplifier from the associated column decoder.

8. The DRAM-like NVM array according to claim 1, wherein each latch-type sense amplifier further comprises:
   two cross-coupled PMOS devices having respective drains connected respectively to the first and second inputs of the corresponding sense amplifier, and respective sources connected to a common-source PMOS transistor; and
   two cross-coupled NMOS devices having respective drains connected respectively to the first and second inputs of the corresponding sense amplifier, and respective sources connected to a common-source NMOS transistor.

9. The DRAM-like NVM array according to claim 1, further comprising a bit-read operation divided into three steps including discharging, charging and development for reading a selected NVM cell unit.

10. The DRAM-like NVM array according to claim 1, wherein each byte of said NVM cell units has eight first bit lines, eight second bit lines, eight first source lines, eight second source lines and a byte-gated bit line running in parallel.

11. The DRAM-like NVM array according to claim 1, wherein the first and second bit lines of each NVM cell unit are respectively coupled through respective pass-transistors to a shared high voltage bit latch in a page buffer.

12. The DRAM-like NVM array according to claim 1, wherein the first and second bit lines of each NVM cell unit are respectively coupled through respective pass-transistors to two respective high voltage bit latches in a page buffer.

13. The DRAM-like NVM array according to claim 1, further comprising a page-write operation having a first step of a page-erase operation followed by a second step of a page-program operation.

14. The DRAM-like NVM array according to claim 13, wherein a page is divided into an odd-half page and an even-half page in the second step of the page-program operation, and verification of the page-program operation is performed after both odd-half and even-off pages are programmed.

15. The DRAM-like NVM array according to claim 13, wherein a page is divided into an odd-half page and an even-half page in the second step of the page-program operation, and one of the odd-half and even-half pages is programmed and then immediately verified before the other of the odd-half and even-half pages is programmed and verified.

16. The DRAM-like NVM array according to claim 1, wherein each NVM cell device is a 2T FLOTOX-based EEPRM cell comprising:

a 1-poly NMOS select transistor having a drain connected to the drain node of the corresponding NVM cell device, and a gate connected to an associated word line; and a 2-poly NMOS floating-gate transistor having a drain connected to a source of the 1-poly NMOS select transistor, a source connected to the source node of the corresponding NVM cell device, and a gate.

17. The DRAM-like NVM array according to claim 16, wherein each byte of said NVM cell units has eight first bit lines, eight second bit lines, eight first source lines, eight second source lines and a byte-gated bit line running in parallel.

18. The DRAM-like NVM array according to claim 16, wherein each byte of said NVM cell units comprises eight adjacent NVM cell units on a same row, a common gate connected to the gate of each 2-poly floating-gate transistor in the eight adjacent NVM cell units in the byte, and an NMOS common gate select transistor having a gate connected to the word line of the corresponding row and coupling the common gate to a byte-gated bit line.

19. The DRAM-like NVM array according to claim 18, wherein each column decoder has at least one decoder line, at least one NMOS select transistor with a gate connected to the decoder line for coupling the first bit line to the first input of the associated sense amplifier, at least one NMOS select transistor with a gate connected to the decoder line for coupling the second bit line to the second input of the associated sense amplifier.

20. The DRAM-like NVM array according to claim 19, wherein each of the first and second source lines of each column of said NVM cell units is coupled to a source voltage line through at least one NMOS select transistor with a gate connected to the decoder line.

21. The DRAM-like NVM array according to claim 20, wherein in each column of said NVM cell units, the first bit line and the first source line are coupled to a program control signal by a first NMOS program signal coupling device, and the second bit line and the second source line are coupled to the program control signal by a second NMOS program signal coupling device.

22. The DRAM-like NVM array according to claim 21, wherein each column decoder has two inputs respectively connected to the first and second bit lines of the associated column, and two outputs respectively coupled to two inputs of the associated sense amplifier.

23. The DRAM-like NVM array according to claim 22, wherein each column decoder further has a pair of NMOS discharging devices for respectively coupling the two inputs of the associated column decoder to ground, and another pair of NMOS discharging devices for respectively coupling the two outputs of the associated column decoder to ground.

24. The DRAM-like NVM array according to claim 23, wherein each latch-type sense amplifier is coupled to the associated column decoder by a pair of NMOS latch devices controlled by a latch signal to respectively isolate the two inputs of each sense amplifier from the associated column decoder.

25. The DRAM-like NVM array according to claim 24, wherein each latch-type sense amplifier further comprises:

two cross-coupled PMOS devices having respective drains connected respectively to the first and second inputs of the corresponding sense amplifier, and respective sources connected to a common-source PMOS transistor controlled by a first development signal; and two cross-coupled NMOS devices having respective drains connected respectively to the first and second inputs of the corresponding sense amplifier, and respective sources connected to a common-source NMOS transistor controlled by a second development signal.

26. The DRAM-like NVM array according to claim 25, further comprising a bit-erase operation accomplished by the following voltage conditions for erasing a selected NVM cell unit:

applying a high voltage of approximately 16V to the byte-gated bit line of the associated column of the selected NVM cell unit;

applying a high voltage of approximately 16V to the gate of the NMOS common gate select transistor of the row corresponding to the selected NVM cell unit;

applying a voltage of approximately 0V to the remaining rows not corresponding to the selected NVM cell unit; and applying a voltage of approximately 0V to the first and second bit lines of the associated column, the source voltage line, and the decoder line.

27. The DRAM-like NVM array according to claim 26, wherein each of the two 2-poly NMOS floating-gate transistors in the selected NVM cell unit has a threshold voltage increased to above 4.1V.

28. The DRAM-like NVM array according to claim 25, further comprising a bit-program operation accomplished by the following voltage conditions for programming a selected NVM cell unit:

applying a voltage of approximately 0V to the byte-gated bit line of the associated column of the selected NVM cell unit;

applying a high voltage of approximately 16V to the gate of the NMOS common gate select transistor of the row corresponding to the selected NVM cell unit;

applying a voltage of approximately 0V to the remaining rows not corresponding to the selected NVM cell unit;

applying a voltage of approximately 0V to source voltage line;

applying a voltage of approximately 7V greater than a threshold voltage of the NMOS program signal coupling devices to the program control signal; and applying a power supply voltage VDD to the decoder line.

29. The DRAM-like NVM array according to claim 28, further applying a voltage of approximately 0V to both the bit line and the source line of the 2-poly NMOS floating-gate transistor in the selected NVM cell unit to be programmed with a decreased threshold voltage of a lower value, and applying a first voltage of approximately 16V and a second voltage of approximately 7V respectively to the bit line and the source line of the other 2-poly NMOS floating-gate transistor in the selected NVM cell unit desired to keep an unchanged threshold voltage.

30. The DRAM-like NVM array according to claim 29, wherein the decreased threshold voltage is below −1.6V and the unchanged threshold voltage is above 4.1V.

31. The DRAM-like NVM array according to claim 25, further comprising a bit-read operation divided into three steps including discharging, charging and development for reading a selected NVM cell unit.

32. The DRAM-like NVM array according to claim 31, wherein the step of discharging is accomplished by applying a power supply voltage VDD to gates of the NMOS discharging devices in the associated column, the source voltage line, and the decoder line.

33. The DRAM-like NVM array according to claim 31, wherein the step of charging is accomplished by applying a voltage equal to or less than a voltage level of the first source line or the second source line in the selected NVM cell unit.

34. The DRAM-like NVM array according to claim 31, wherein the step of development is accomplished by grounding the latch signal to turn off the NMOS latch devices in the associated column, and using the first and second development signals to turn on the common-source PMOS transistor and the common-source NMOS transistor in the associated latch-type sense amplifier.

35. The DRAM-like NVM array according to claim 16, wherein the first and second bit lines of each NVM cell unit are respectively coupled through respective pass-transistors to a shared high voltage bit latch in a page buffer.

36. The DRAM-like NVM array according to claim 16, wherein the first and second bit lines of each NVM cell unit are respectively coupled through respective pass-transistors to two respective high voltage bit latches in a page buffer.

37. The DRAM-like NVM array according to claim 16, further comprising a page-write operation including a first step of a page-erase operation followed by a second step of a page-program operation.

38. The DRAM-like NVM array according to claim 37, wherein a page is divided into an odd-half page and an even-half page in the second step of the page-program operation, and verification of the program operation is performed after both odd-half and even-off pages are programmed.

39. The DRAM-like NVM array according to claim 37, wherein a page is divided into an odd-half page and an even-half page in the second step of the page-program operation, and one of the odd-half and even-half pages is programmed and then immediately verified before the other of the odd-half and even-half pages is programmed and verified.

40. The DRAM-like NVM array according to claim 1, wherein each NVM cell device is a 2T flash cell comprising:
 a 2-poly floating-gate transistor having a drain connected to the drain node of the corresponding NVM cell device, and a gate connected to an associated word line; and
 a 1-poly select transistor having a drain connected to a source of the 2-poly float-gate transistor, a source connected to the source node of the corresponding NVM cell device, and a gate;
 wherein the 2T flash cell is formed in a triple P-well within a deep N-well on top of a P-substrate.

41. The DRAM-like NVM array according to claim 1, wherein each NVM cell device is a 1T flash cell comprising:
 a 2-poly floating-gate transistor having a drain connected to the drain node of the corresponding NVM cell device, a gate connected to an associated word line, and a source connected to the source node of the corresponding NVM cell device;
 wherein the 1T flash cell is formed in a triple P-well within a deep N-well on top of a P-substrate.

42. The DRAM-like NVM array according to claim 1, wherein each NVM cell device is a 1.5T split-gate flash cell comprising:
 a 2-poly split-gate transistor having a drain connected to the drain node of the corresponding NVM cell device, a gate connected to an associated word line, and a source connected to the source node of the corresponding NVM cell device;
 wherein the 1.5T split-gate flash cell is formed on top of a P-substrate and comprises two 2-poly floating-gate transistors connected in series and physically squeezed into one transistor area.

43. The DRAM-like NVM array according to claim 1, wherein each two word lines are associated with a same row of said NVM cell units and each NVM cell device is 2T flash cell comprising:
 a first 2-poly floating-gate transistor having a drain connected to the drain node of the corresponding NVM cell device, and a gate connected to a first associated word line; and
 a second 2-poly floating-gate transistor having a drain connected to a source of the first 2-poly float-gate transistor, a source connected to the source node of the corresponding NVM cell device, and a gate connected to a second associated word line;
 wherein the 2T flash cell is formed in a triple P-well within a deep N-well on top of a P-substrate.

* * * * *